(12) United States Patent
Liu et al.

(10) Patent No.: US 11,600,534 B2
(45) Date of Patent: Mar. 7, 2023

(54) SOURCE/DRAIN STRUCTURES AND METHOD OF FORMING

(71) Applicant: Taiwan Semiconductor Manufacturing Co., Ltd., Hsinchu (TW)

(72) Inventors: Wei-Min Liu, Hsinchu (TW); Hsueh-Chang Sung, Zhubei (TW); Li-Li Su, ChuBei (TW); Yee-Chia Yeo, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 28 days.

(21) Appl. No.: 17/218,459

(22) Filed: Mar. 31, 2021

(65) Prior Publication Data

US 2022/0319934 A1    Oct. 6, 2022

(51) Int. Cl.
*H01L 21/8238* (2006.01)
*H01L 27/092* (2006.01)
*H01L 29/08* (2006.01)
*H01L 29/49* (2006.01)
*H01L 29/78* (2006.01)
*H01L 29/66* (2006.01)

(52) U.S. Cl.
CPC ........ *H01L 21/823864* (2013.01); *H01L 21/823814* (2013.01); *H01L 21/823821* (2013.01); *H01L 21/823871* (2013.01); *H01L 27/0924* (2013.01); *H01L 29/0847* (2013.01); *H01L 29/4983* (2013.01); *H01L 29/6656* (2013.01); *H01L 29/66545* (2013.01); *H01L 29/66636* (2013.01); *H01L 29/66795* (2013.01); *H01L 29/7851* (2013.01)

(58) Field of Classification Search
CPC ..... H01L 21/823864; H01L 21/823814; H01L 21/823821; H01L 21/823871; H01L 27/0924; H01L 29/0847; H01L 29/4983; H01L 29/66545; H01L 29/6656; H01L 29/66636; H01L 29/66795; H01L 29/7851
See application file for complete search history.

(56) References Cited

U.S. PATENT DOCUMENTS 8,962,400 B2   2/2015   Tsai et al.
9,093,514 B2   7/2015   Tsai et al.
9,236,267 B2   1/2016   De et al.
(Continued)

*Primary Examiner* — Karen Kusumakar
*Assistant Examiner* — Adam S Bowen
(74) *Attorney, Agent, or Firm* — Slater Matsil, LLP

(57) ABSTRACT

A semiconductor device includes a first device region and a second device region. The first device region includes a first source/drain region extending from a substrate and a first and a second pair of spacers. The first source/drain region extends between the first pair of spacers and the second pair of spacers. The first pair of spacers and the second pair of spacers have a first height. The second device region includes a second and a third source/drain region extending from the substrate and a third and a fourth pair of spacers. The third source/drain region is separate from the second source/drain region. The second source/drain region extends between the third pair of spacers. The third source/drain region extends between the fourth pair of spacers. The third pair of spacers and the fourth pair of spacers have a second height greater than the first height.

20 Claims, 44 Drawing Sheets

(56) References Cited

U.S. PATENT DOCUMENTS

| | | | |
|---|---|---|---|
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2018/0308852 | A1* | 10/2018 | Lee .................. H01L 21/31111 |

\* cited by examiner

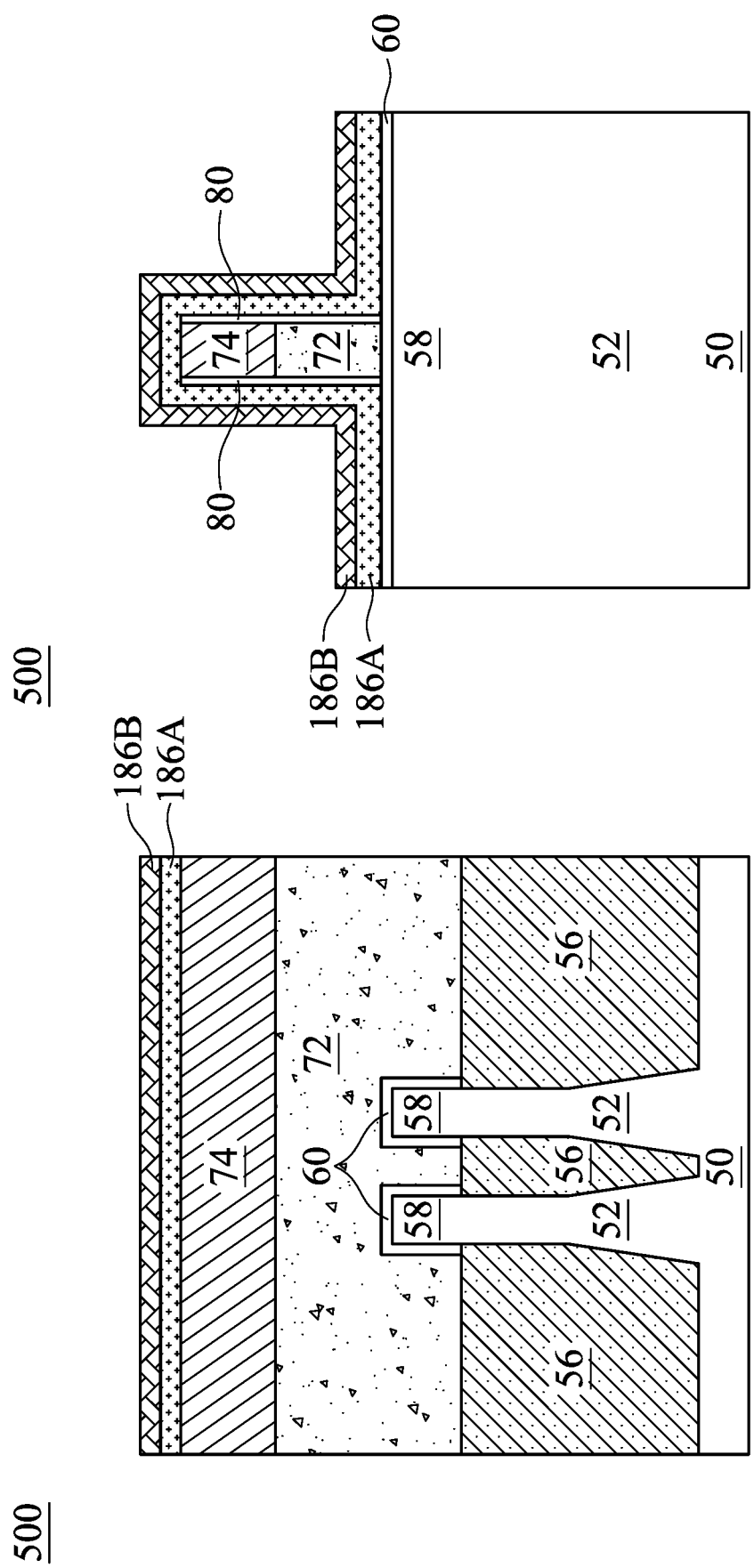
FIG. 10A1    FIG. 10B1

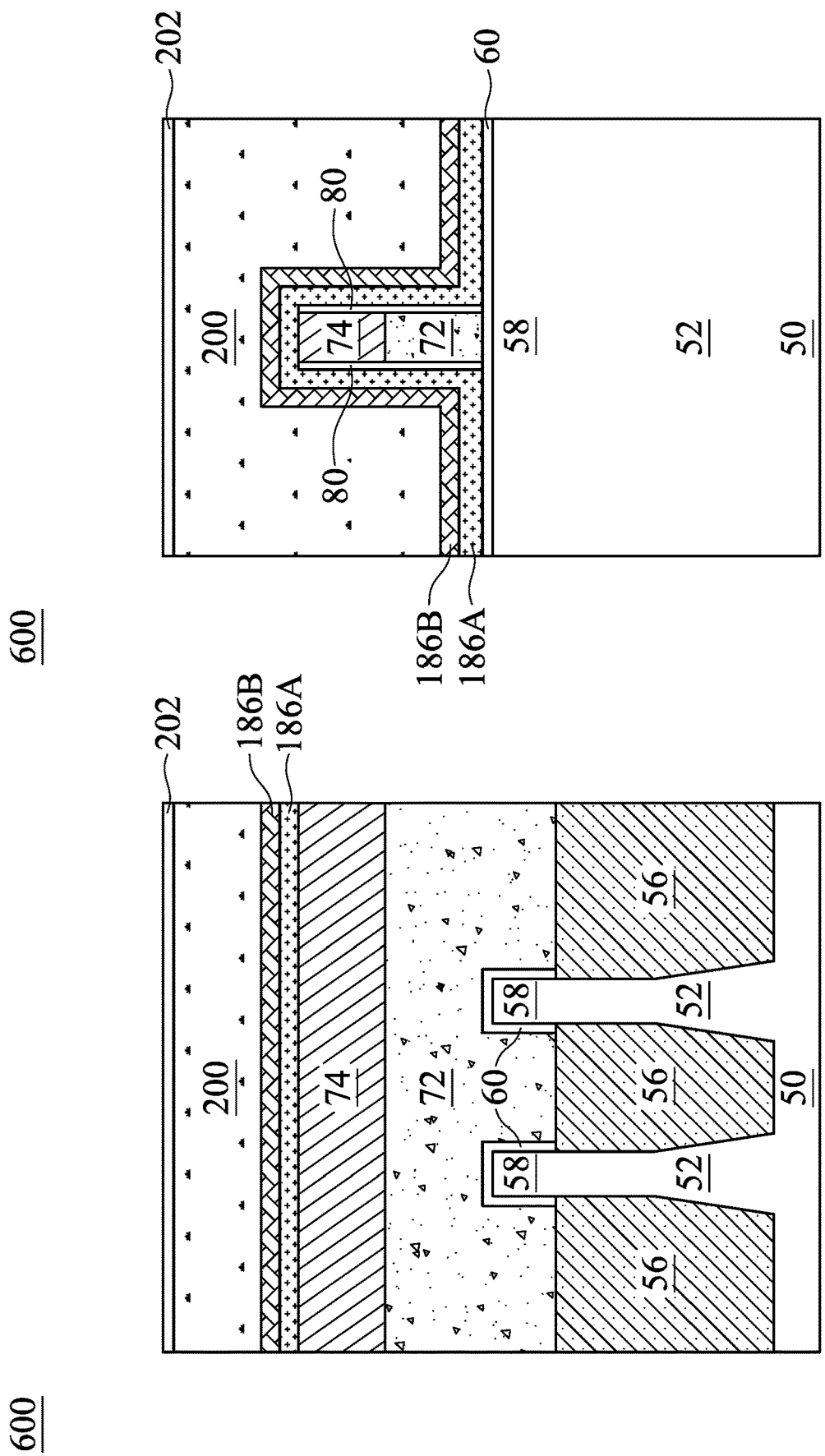

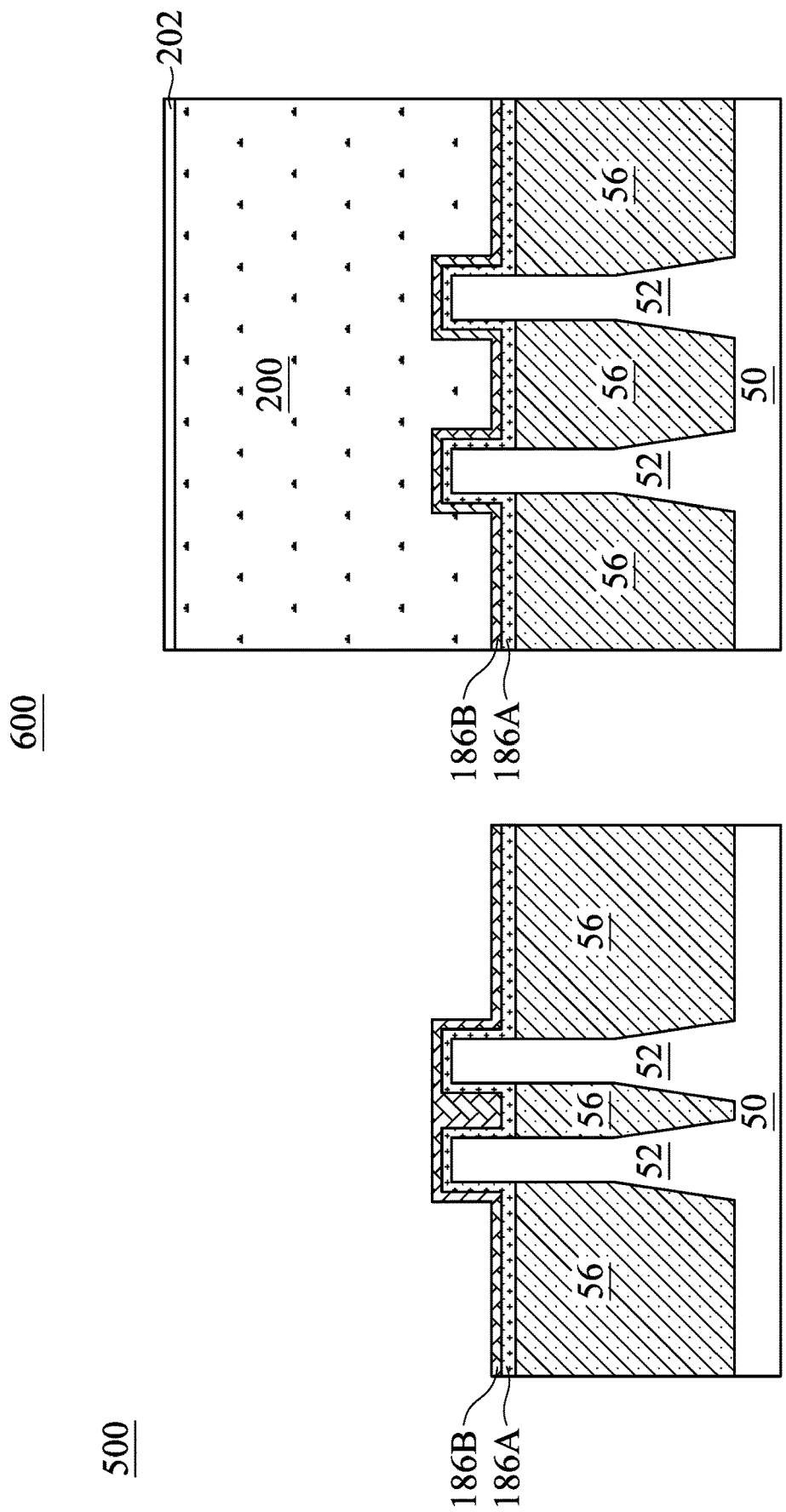

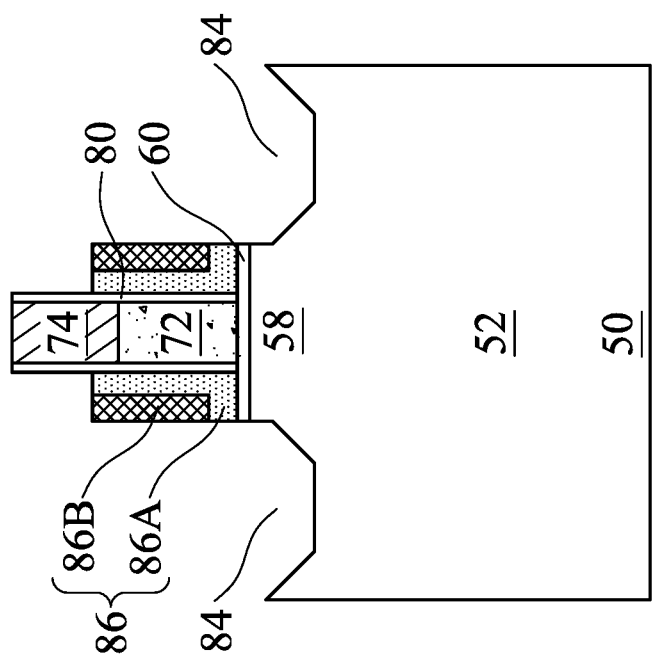
FIG. 11B1
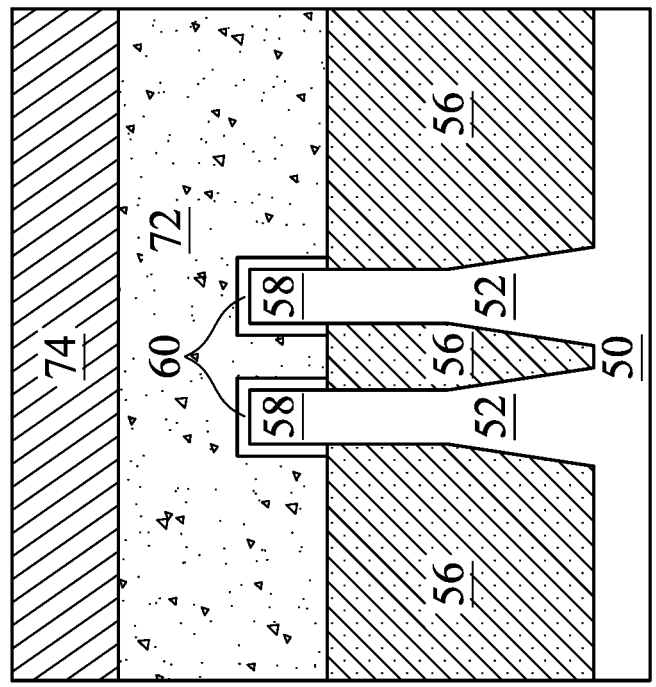
FIG. 11A1

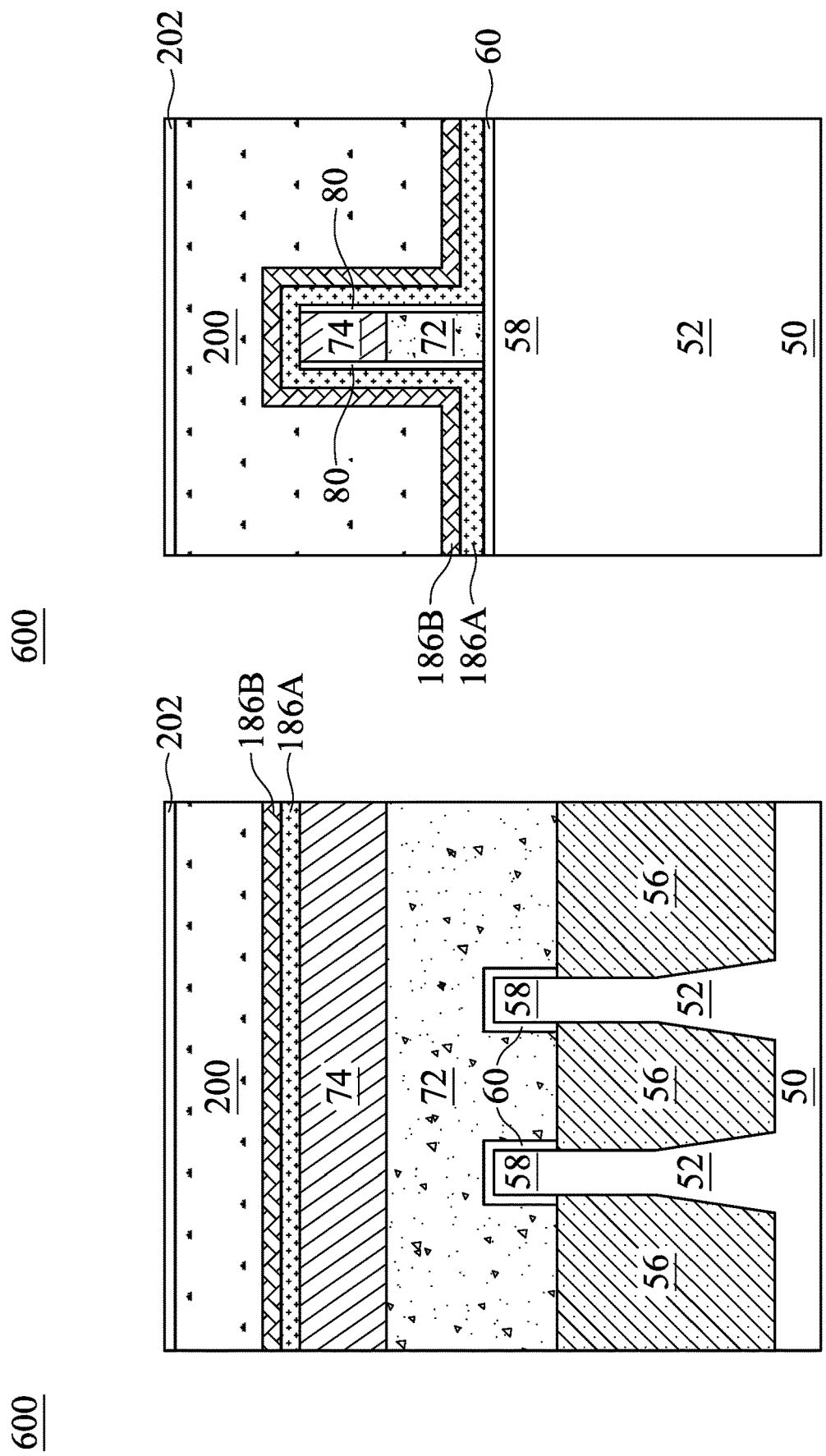

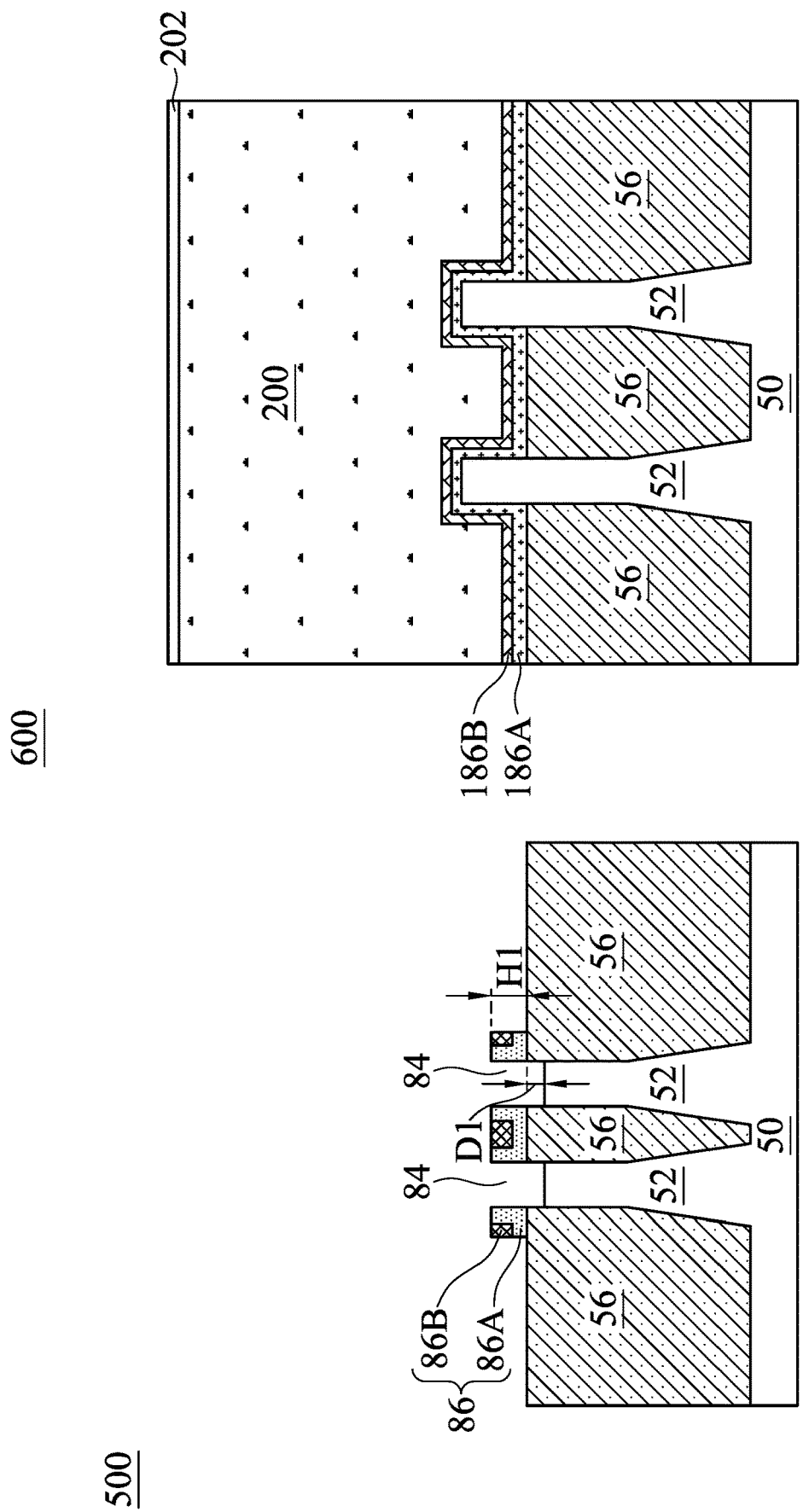

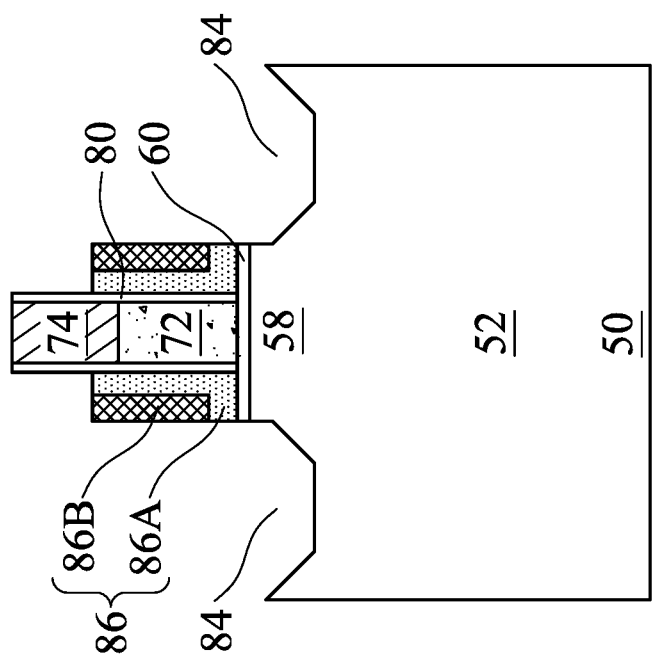
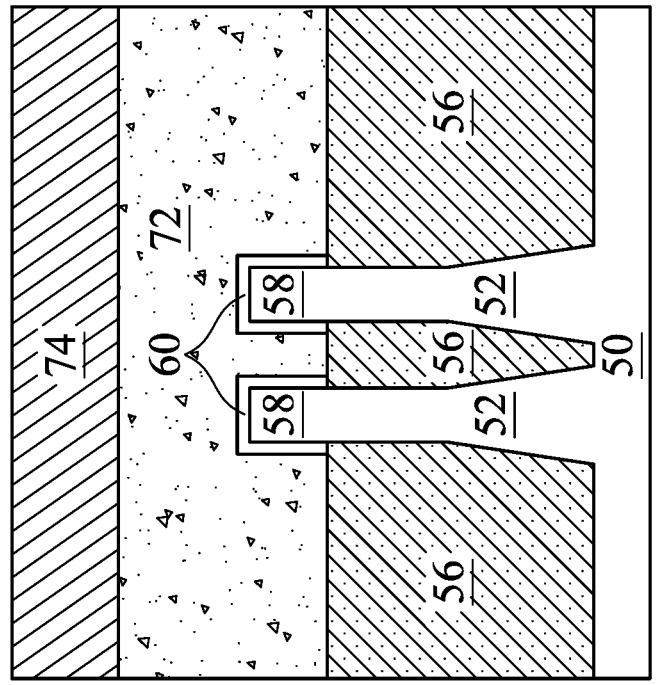
FIG. 12B1
FIG. 12A1

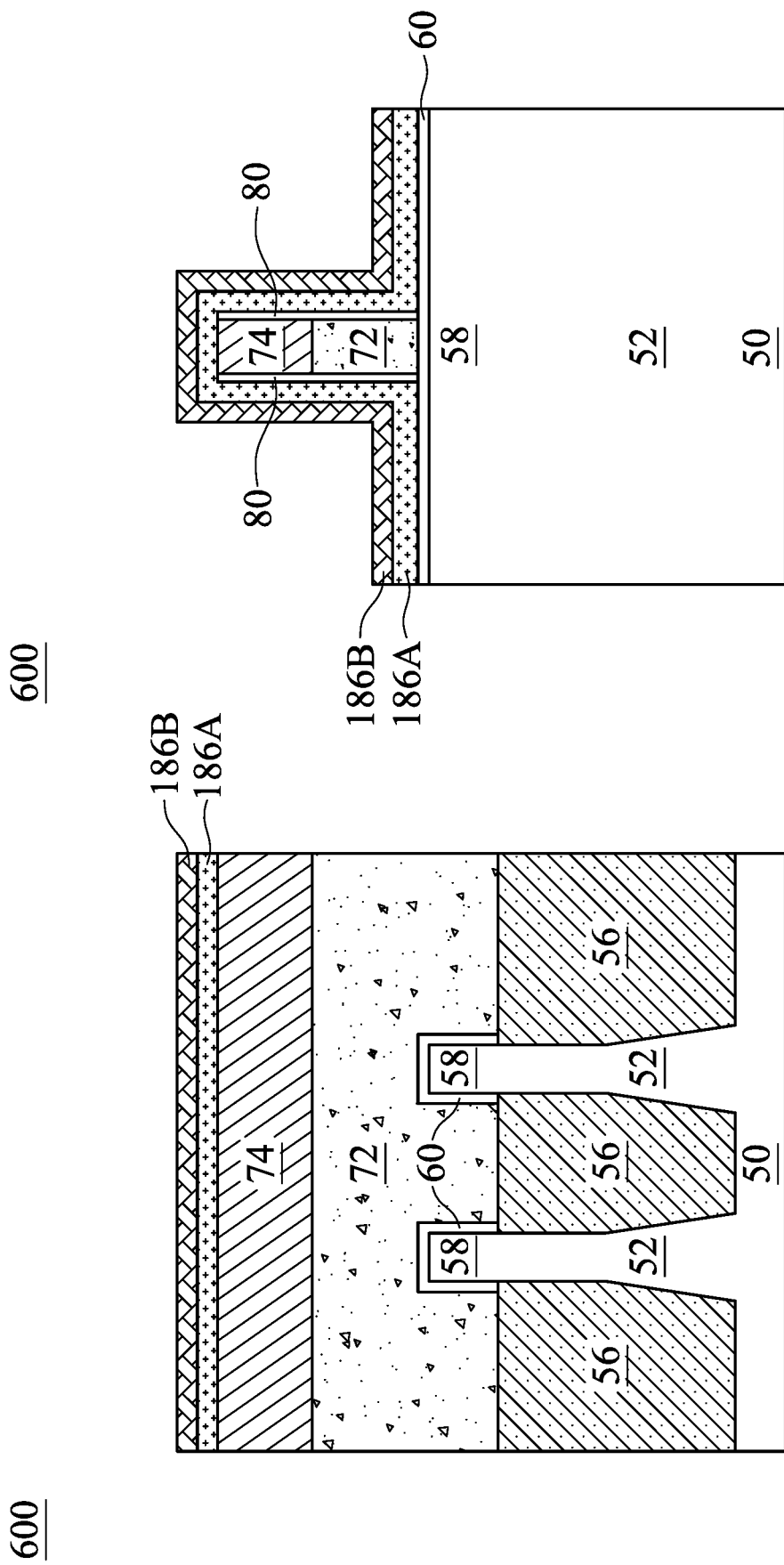

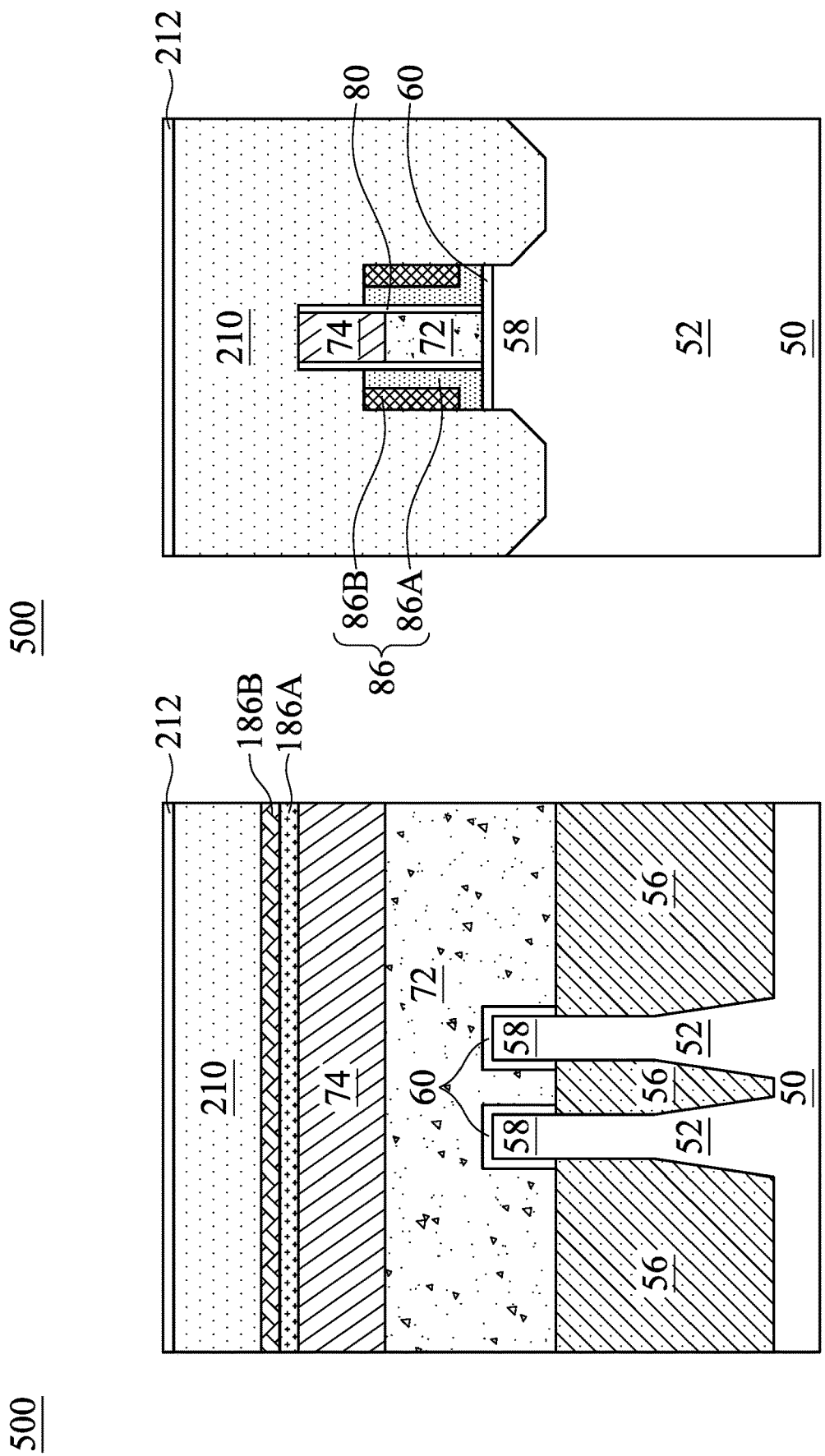
FIG. 13A1  FIG. 13B1

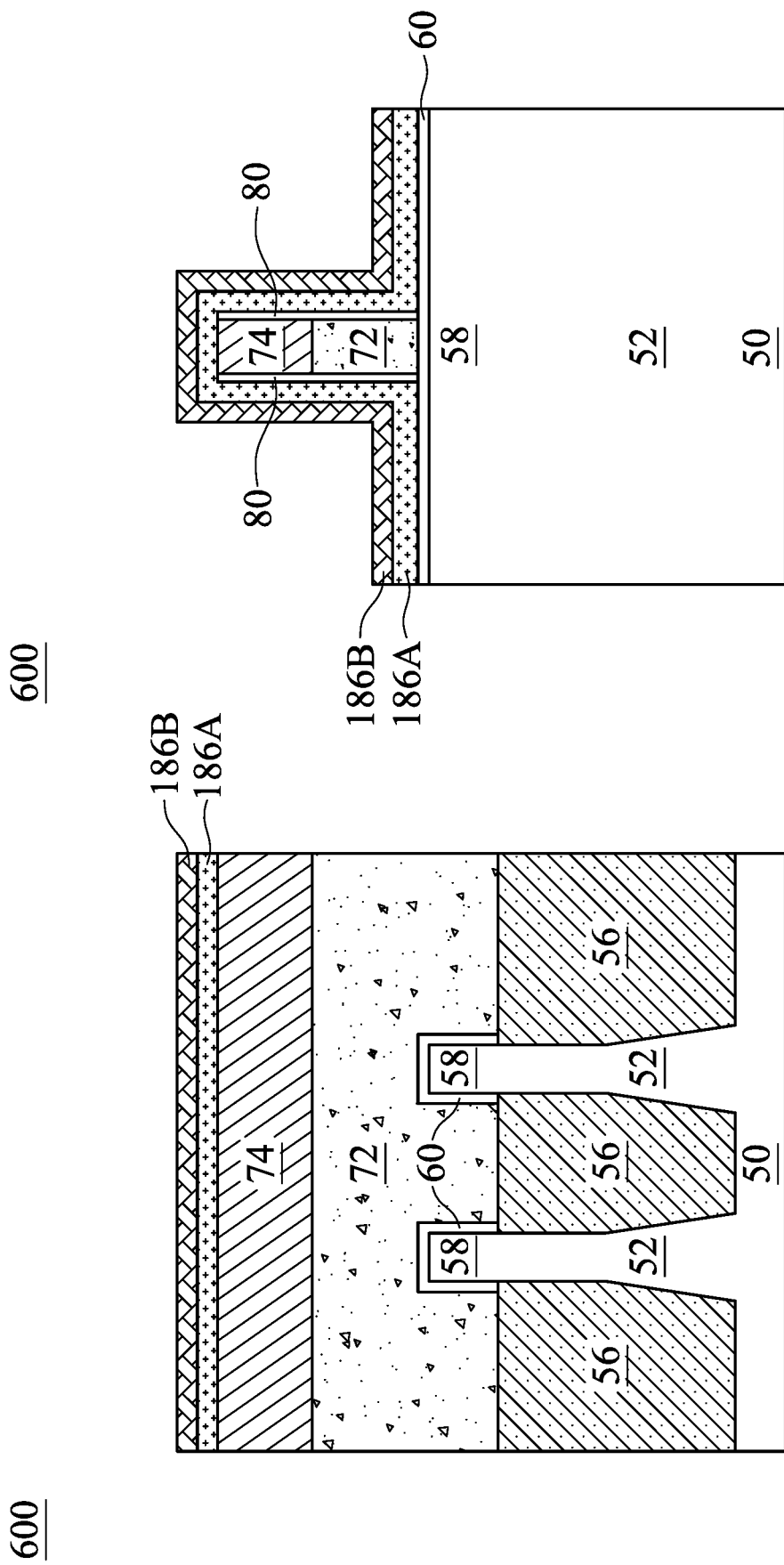

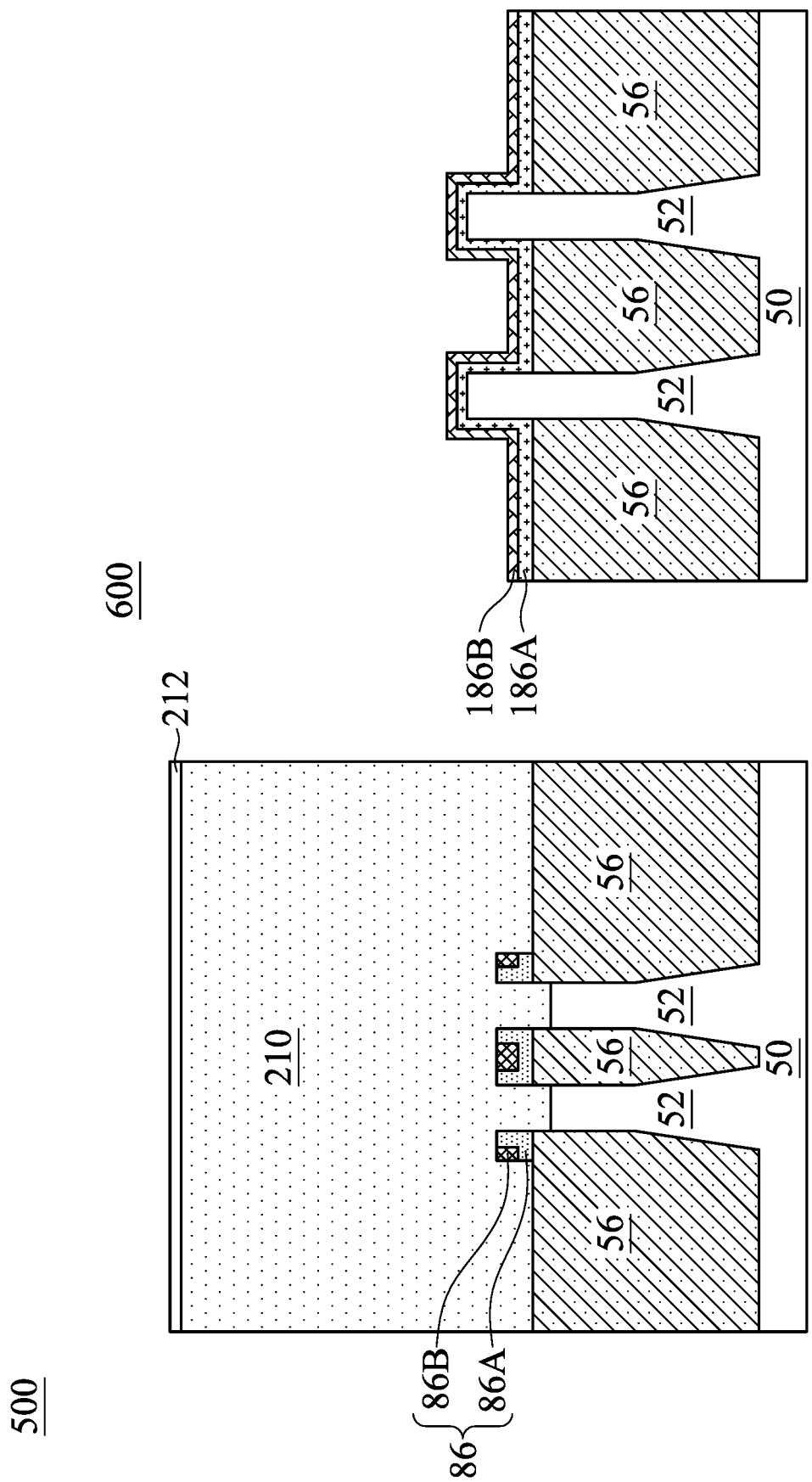

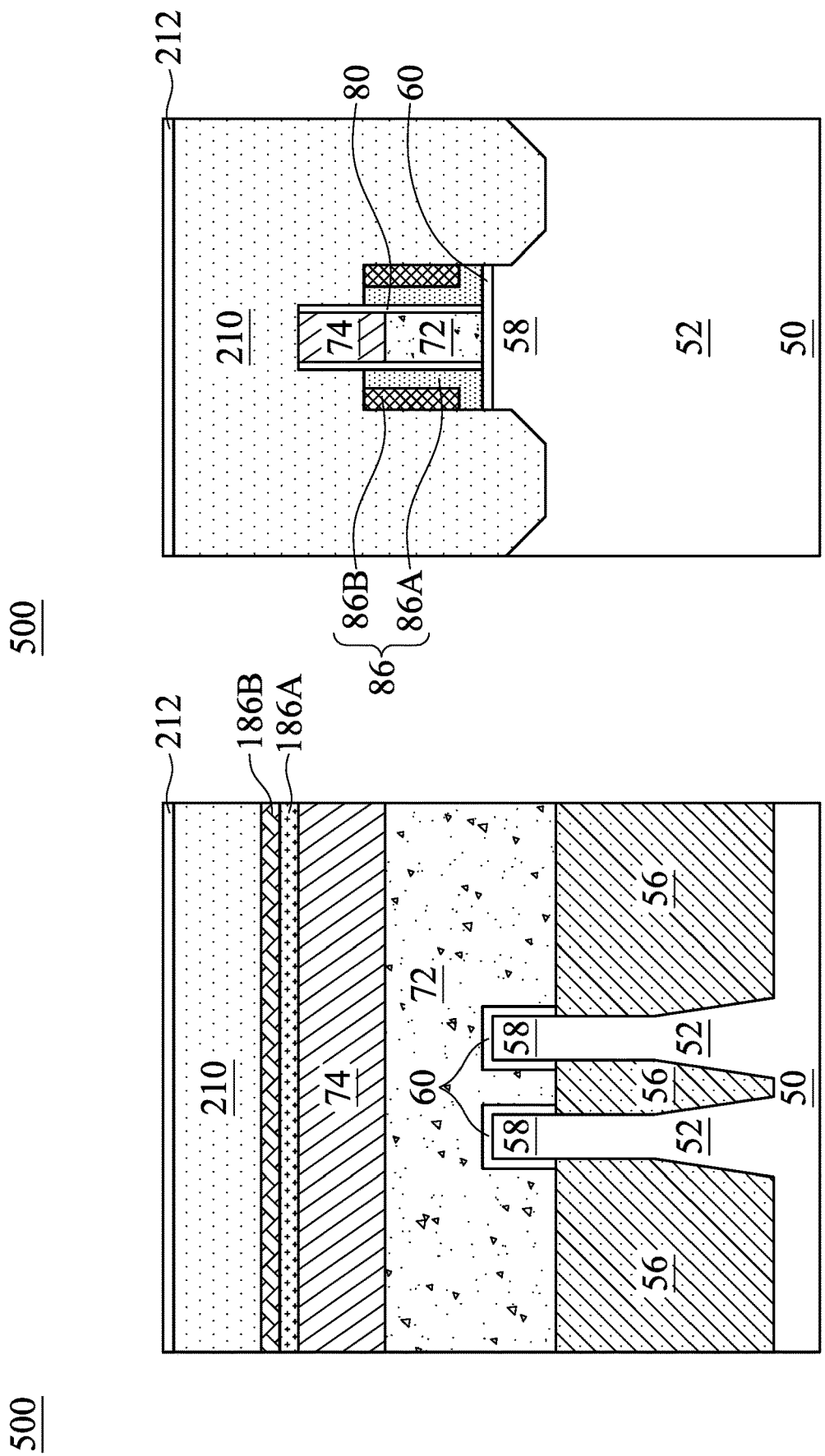
FIG. 14B1
FIG. 14A1

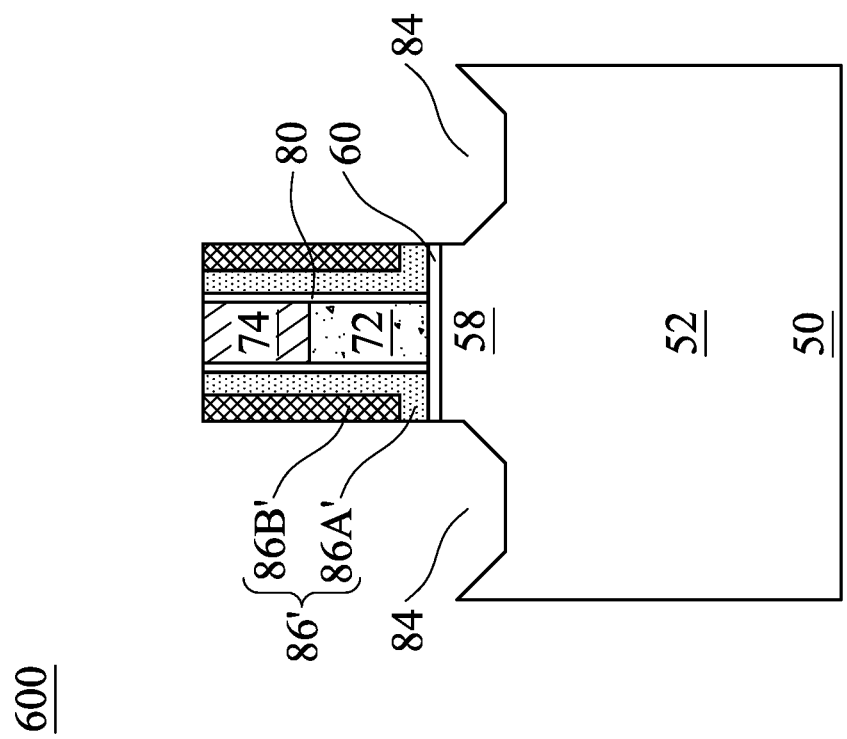
FIG. 14B2
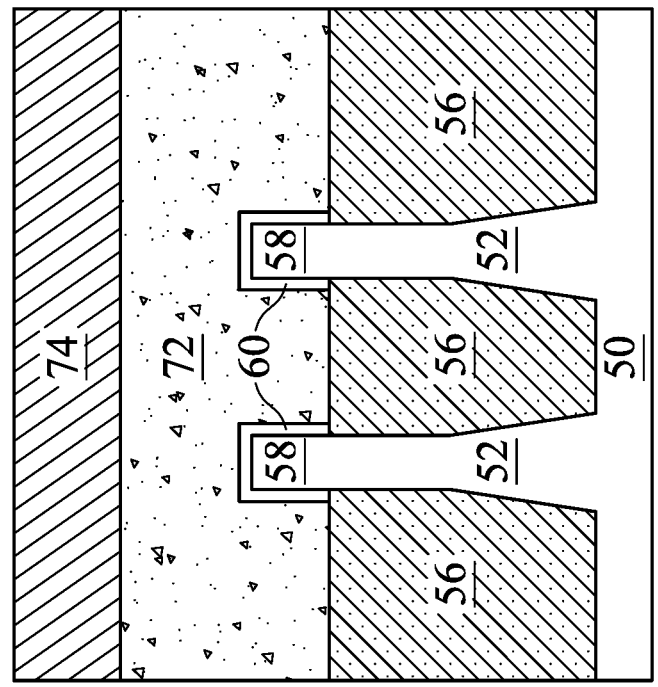
FIG. 14A2

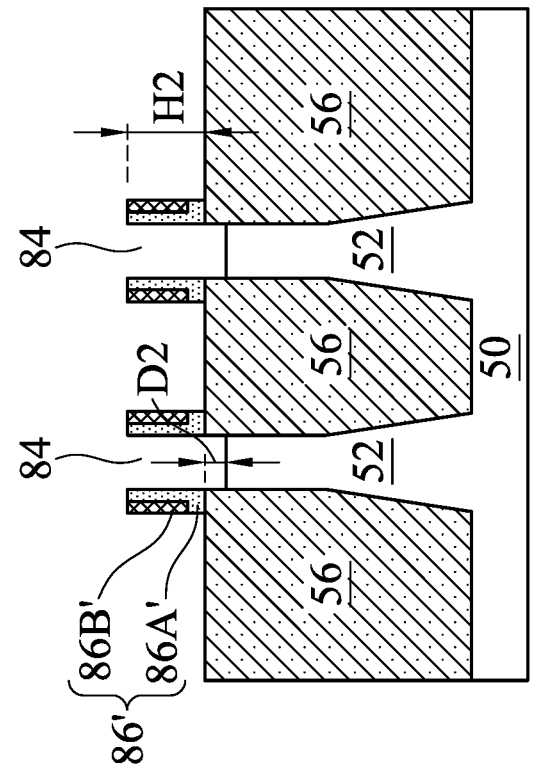
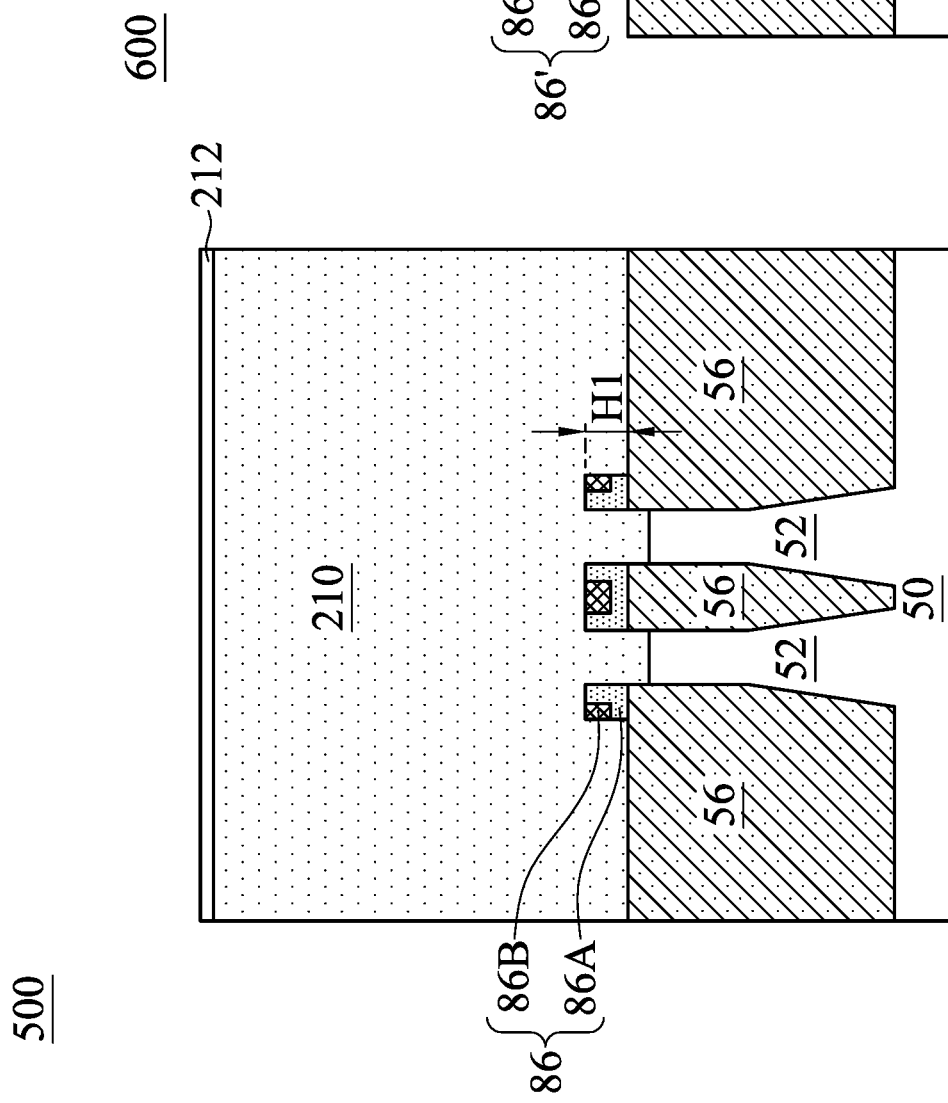
FIG. 14C
FIG. 14D

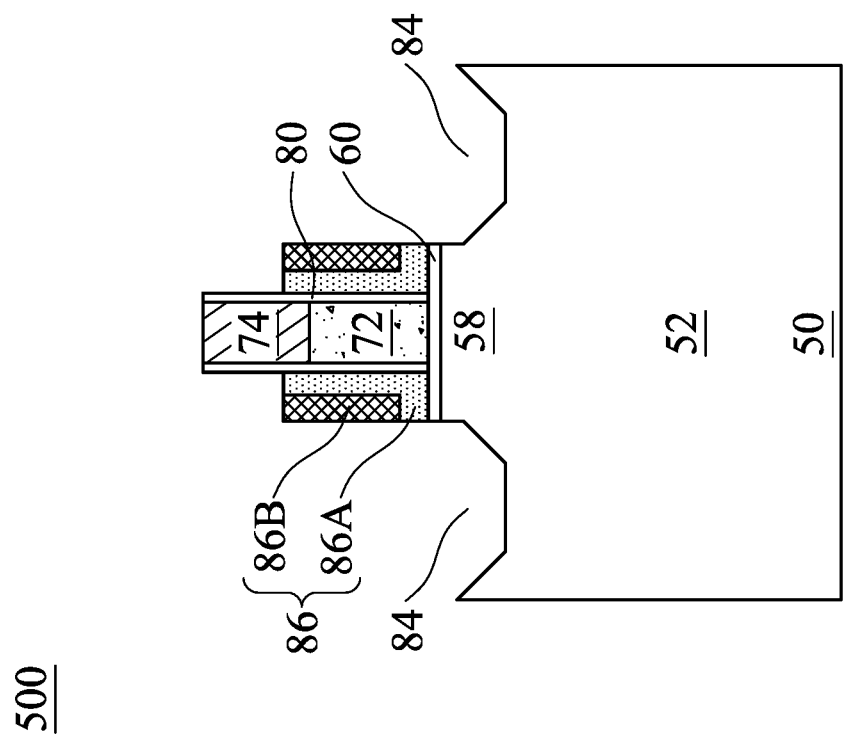
FIG. 15B1
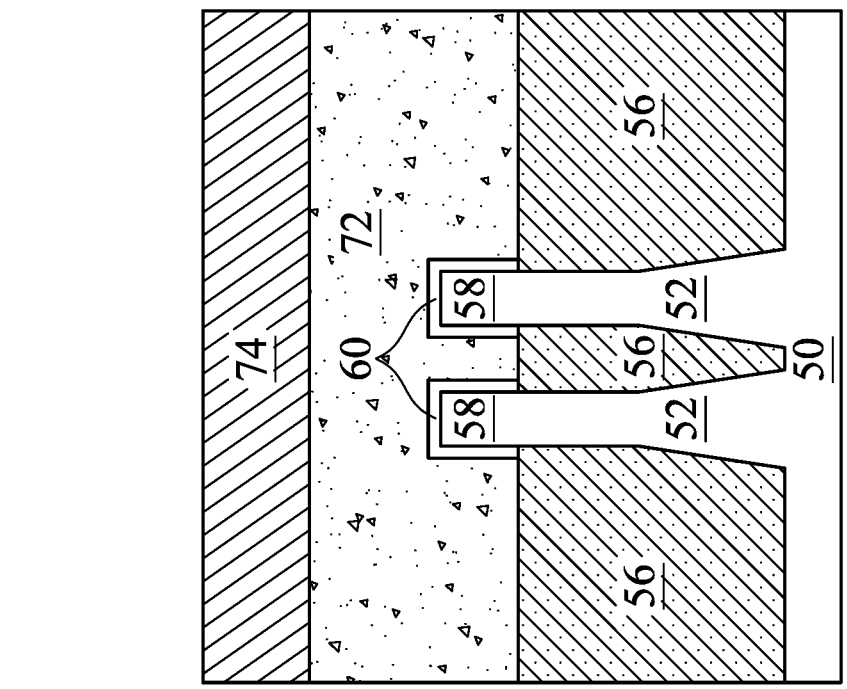
FIG. 15A1

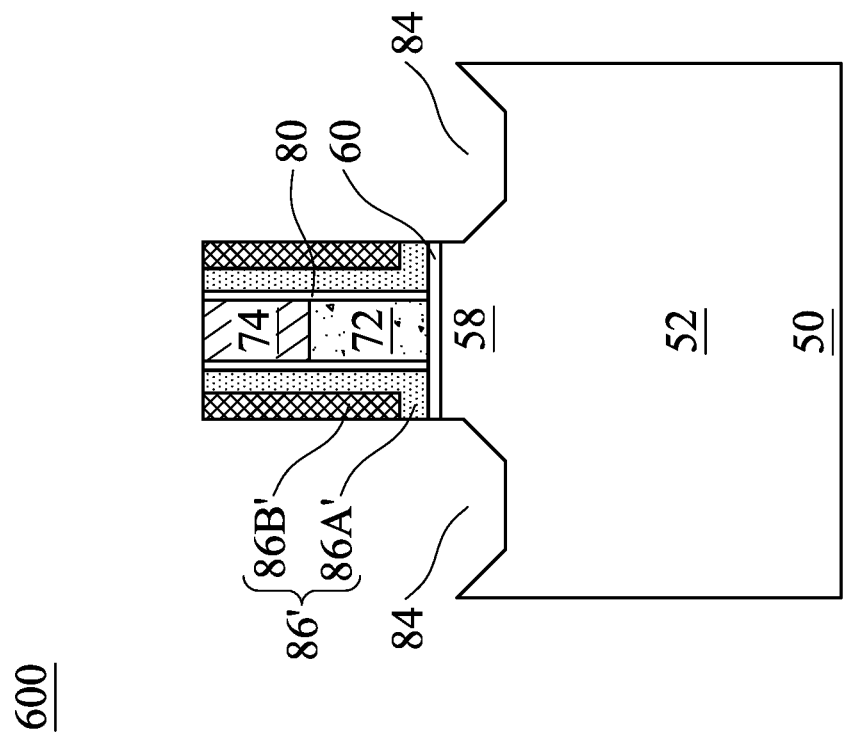
FIG. 15B2
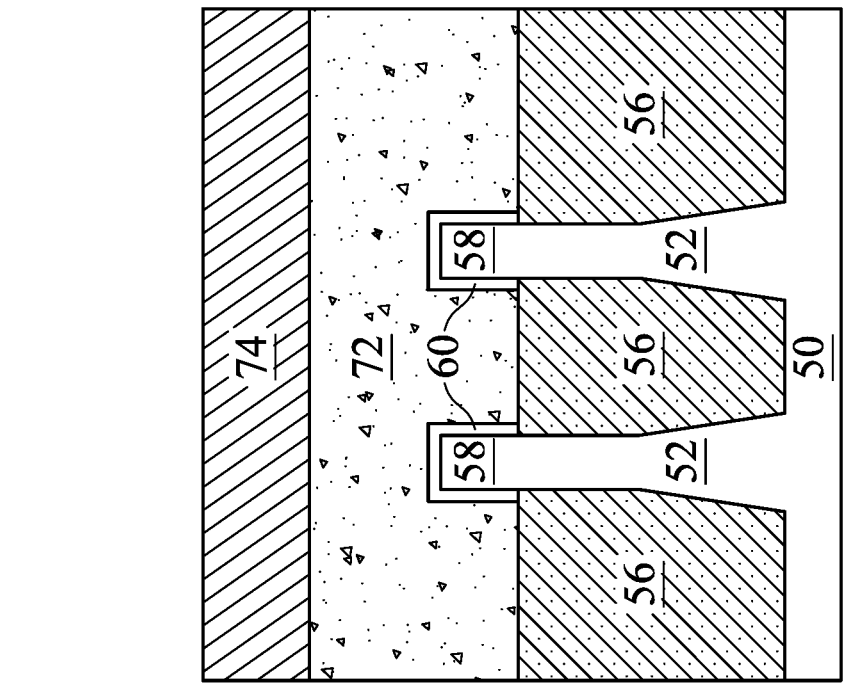
FIG. 15A2

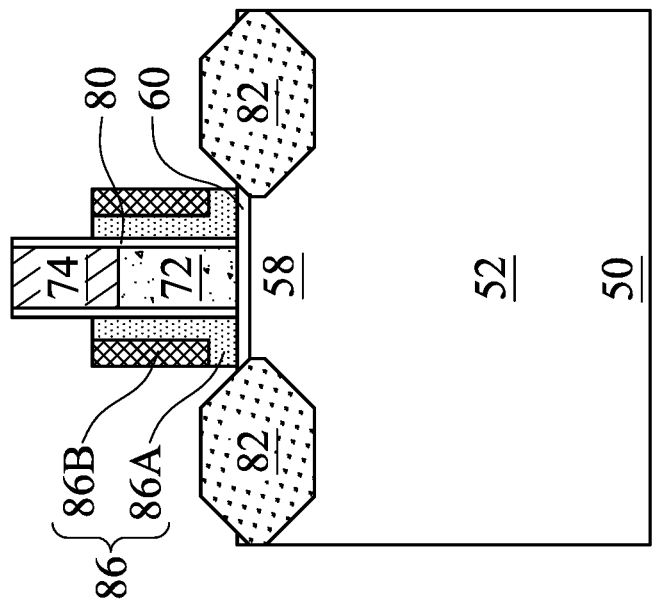
FIG. 16B1
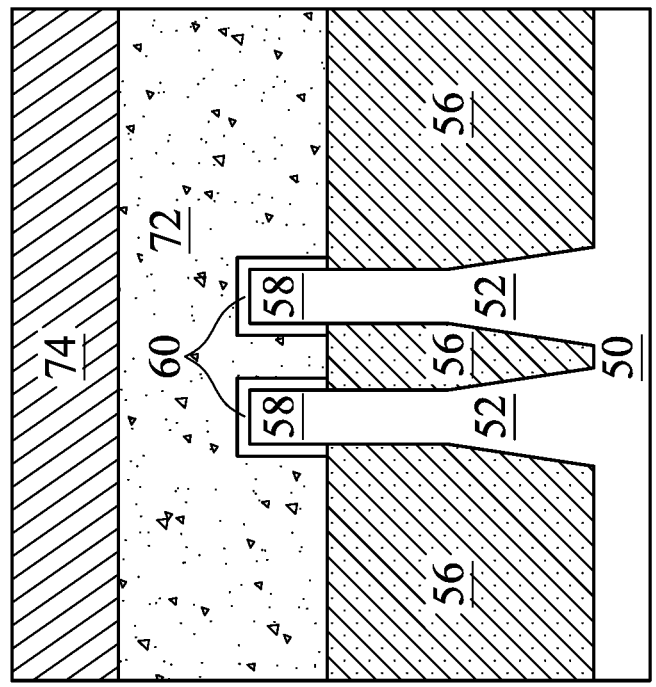
FIG. 16A1

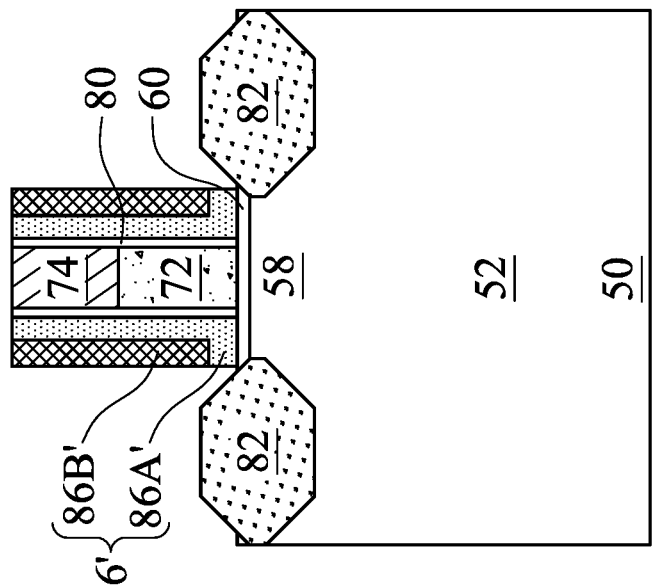
FIG. 16B2
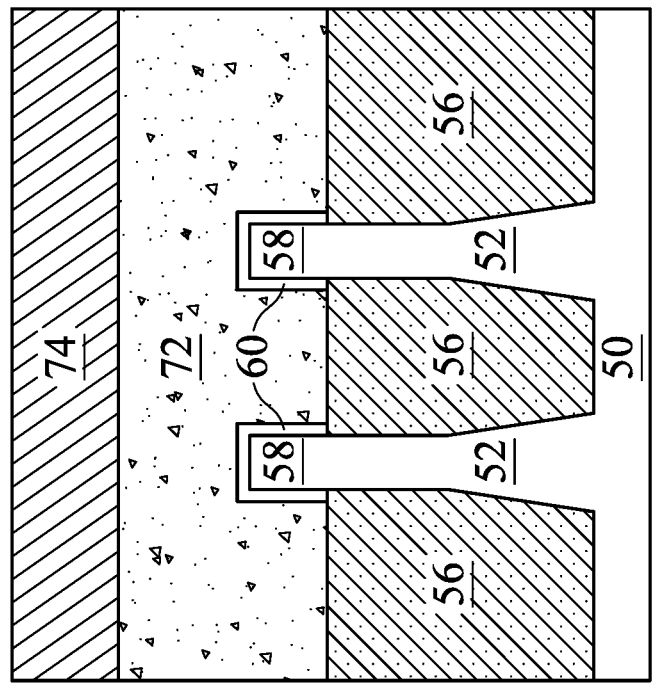
FIG. 16A2

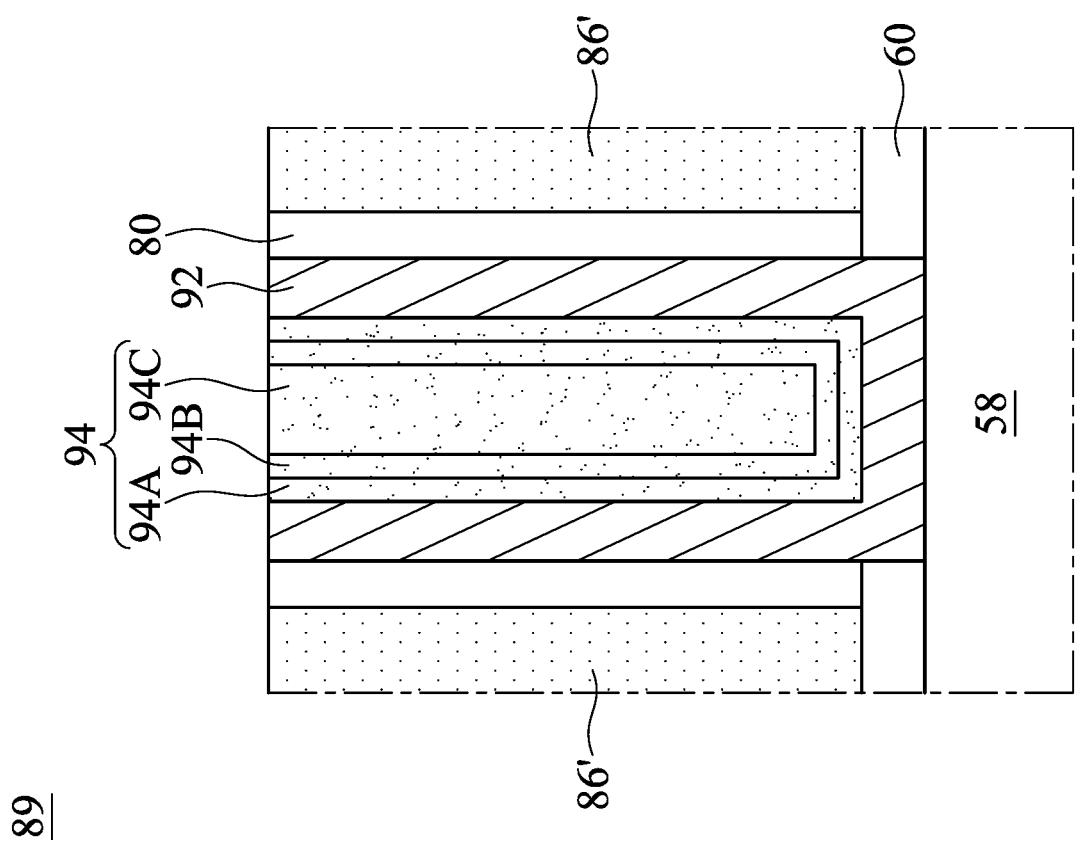

SOURCE/DRAIN STRUCTURES AND METHOD OF FORMING

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 8C, 8D, 9A, 9B, 9C, 9D, 10A1, 10B1, 10A2, 10B2, 10C, 10D, 10E, 11A1, 11B1, 11A2, 11B2, 11C, 11D, 11E, 12A1, 12B1, 12A2, 12B2, 12C, 12D, 13A1, 13B1, 13A2, 13B2, 13C, 13D, 14A1, 14B1, 14A2, 14B2, 14C, 14D, 14E, 14F, 15A1, 15B1, 15A2, 15B2, 15C, 15D, 16A1, 16B1, 16A2, 16B2, 16C, 16D, 16E, 16F, 16G, 17A, 17B, 18A, 18B, 19A, 19B, 20A, 20B, 20C, 21A, 21B, 22A, and 22B are cross-sectional views of intermediate stages in the manufacturing of FinFETs, in accordance with some embodiments.

DETAILED DESCRIPTION

Figure 1:
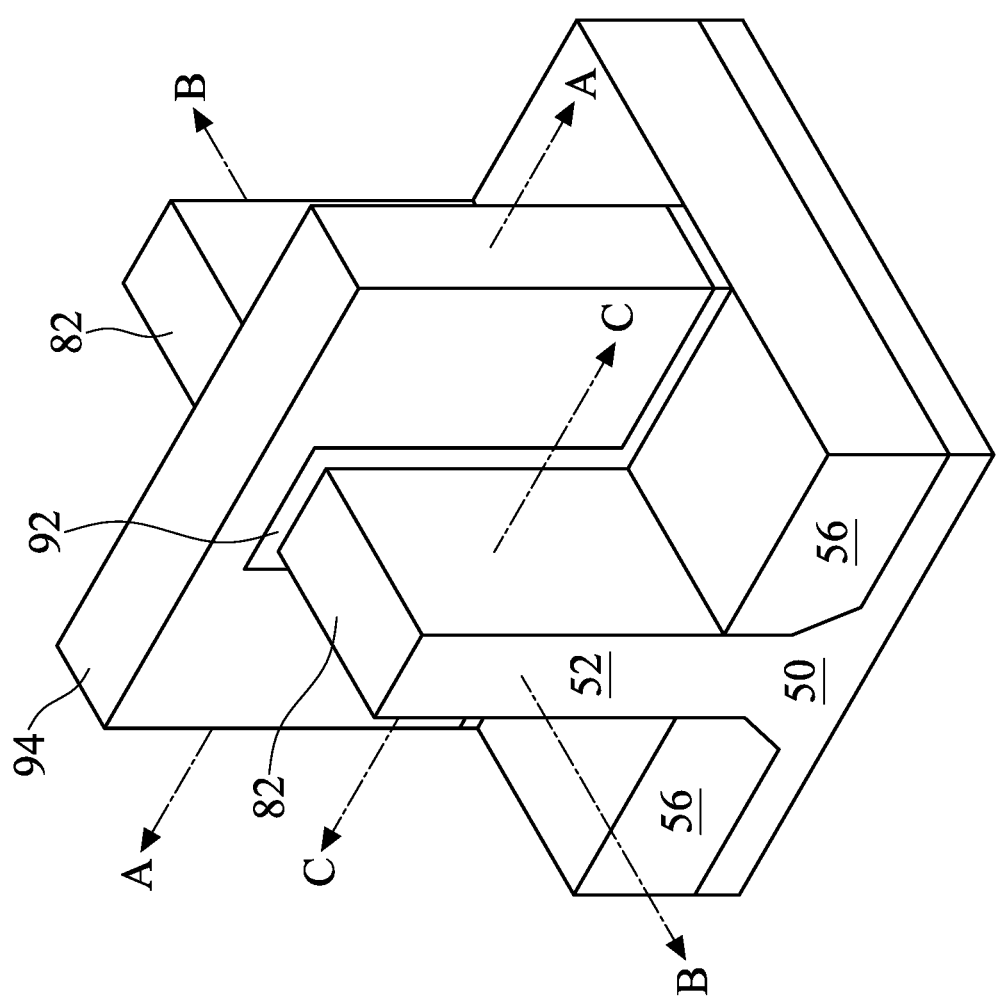
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed below may be useful for controlling critical dimensions (CDs) of source/drain regions for various devices to avoid yield loss by adjusting the heights of spacers. N-type and p-type epitaxial source/drain regions may be simultaneously epitaxially grown across n-type regions and p-type regions, respectively, to increase yield throughput. Additionally, embodiments may provide epitaxially growing merged source/drain regions for multi-fin transistors in, e.g., logic device regions, while simultaneously epitaxially growing separate source/drain regions for single fin transistors in, e.g., static random access memory (SRAM) device regions with the same epitaxial growth process. In order to encourage or inhibit merging of epitaxial source/drain regions, spacers may be formed to different heights in, e.g., logic device and SRAM device regions. Reducing undesired merging of epitaxial source/drain regions across single fin transistors may inhibit shorts and resulting yield loss. CDs such as widths and heights of the epitaxial source/drain regions may also be determined by controlling the spacer heights.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 22B are cross-sectional views of intermediate stages in the manufacturing of FinFETs, in accordance with some embodiments. FIGS. 2, 3, 4, 5, 6 and 7 illustrate reference cross-section A-A illustrated in FIG. 1, except for multiple fins/FinFETs. FIGS. 8A, 9A, 10A1, 10A2, 11A1, 11A2, 12A1, 12A2, 13A1, 13A2, 14A1, 14A2, 15A1, 15A2, 16A1, 16A2, 17A, 18A, 19A, 20A, 21A, and 22A are illustrated along reference cross-section A-A illustrated in FIG. 1, and FIGS. 8B, 9B, 10B1, 10B2, 11B1, 11B2, 12B1, 12B2, 13B1, 13B2, 14B1, 14B2, 15B1, 15B2, 16B1, 16B2, 17B, 18B, 19B, 20B, 20C, 21B, and 22B are illustrated along a similar cross-section B-B illustrated in FIG. 1, except for multiple fins/FinFETs. FIGS. 8C, 8D, 9C, 9D, 10C, 10D, 10E, 11C, 11D, 11E, 12C, 12D, 13C, 13D, 14C, 14D, 14E, 14F, 15C, 15D, 16C, 16D, 16E, 16F, and 16G are illustrated along reference cross-section C-C illustrated in FIG. 1, except for multiple fins/FinFETs.

Figure 2:
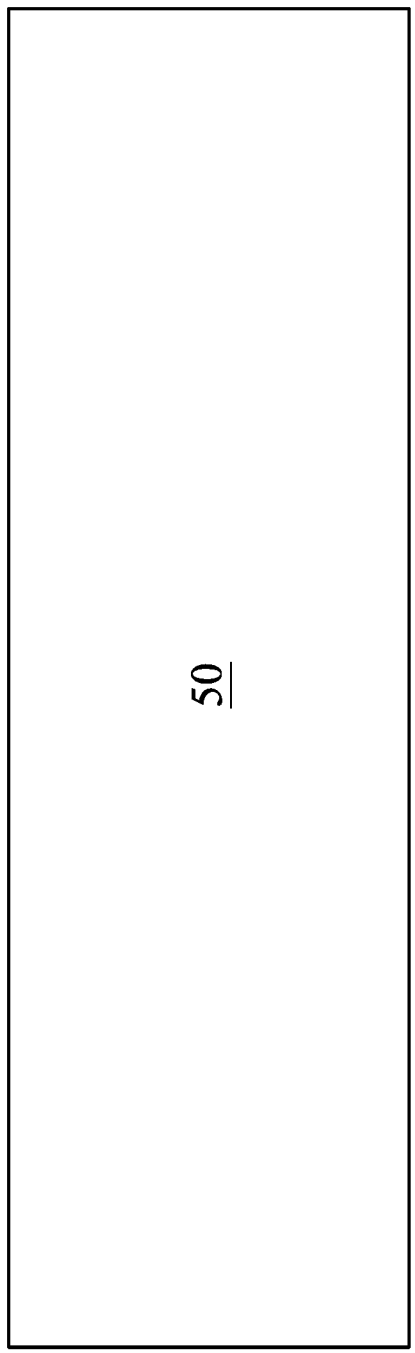

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 may have an n-type region and a p-type region (not individually shown). The n-type region can be for forming n-type devices, such as NMOS transistors, e.g., n-type FinFETs. The p-type region can be for forming p-type devices, such as PMOS transistors, e.g., p-type FinFETs. The n-type region may be physically separated from the p-type region, and any number of device features (e.g., other active devices, doped regions, isolation structures, etc.) may be disposed between the n-type region and the p-type region.

Figure 3:
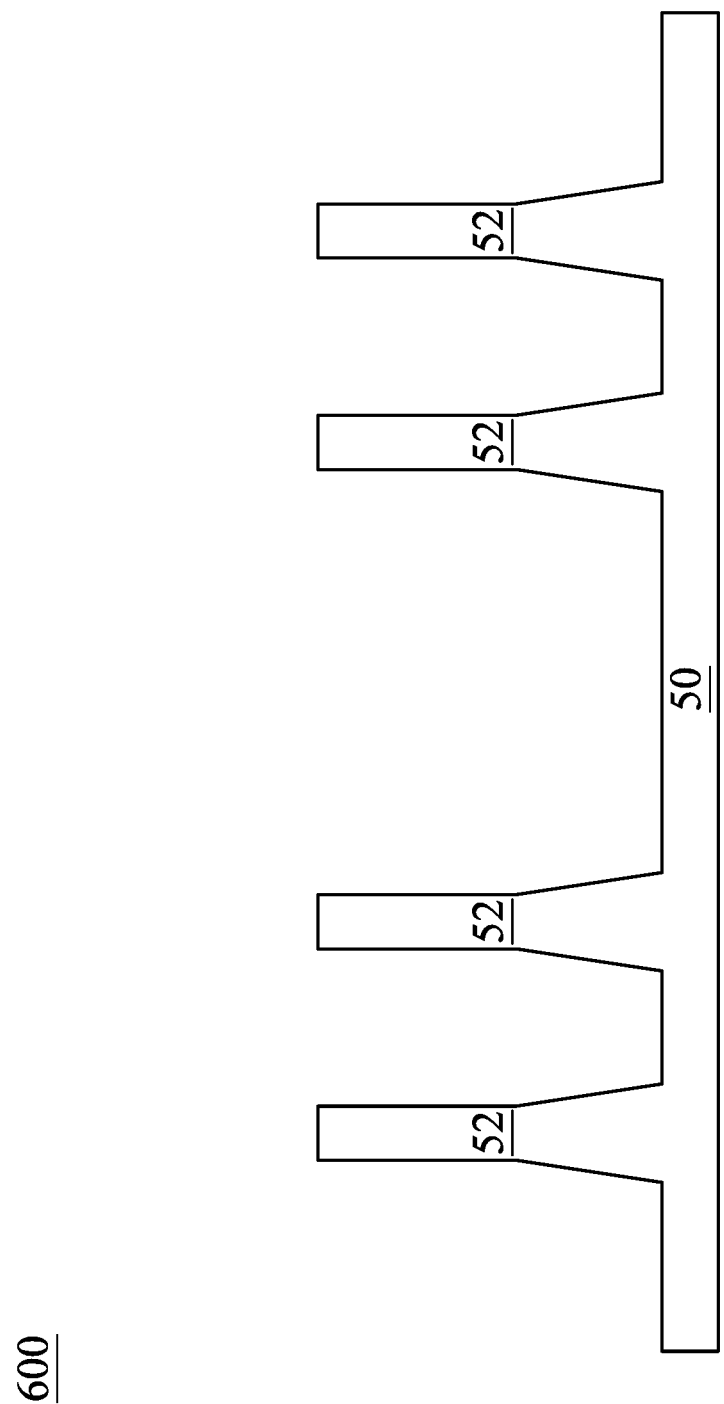

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
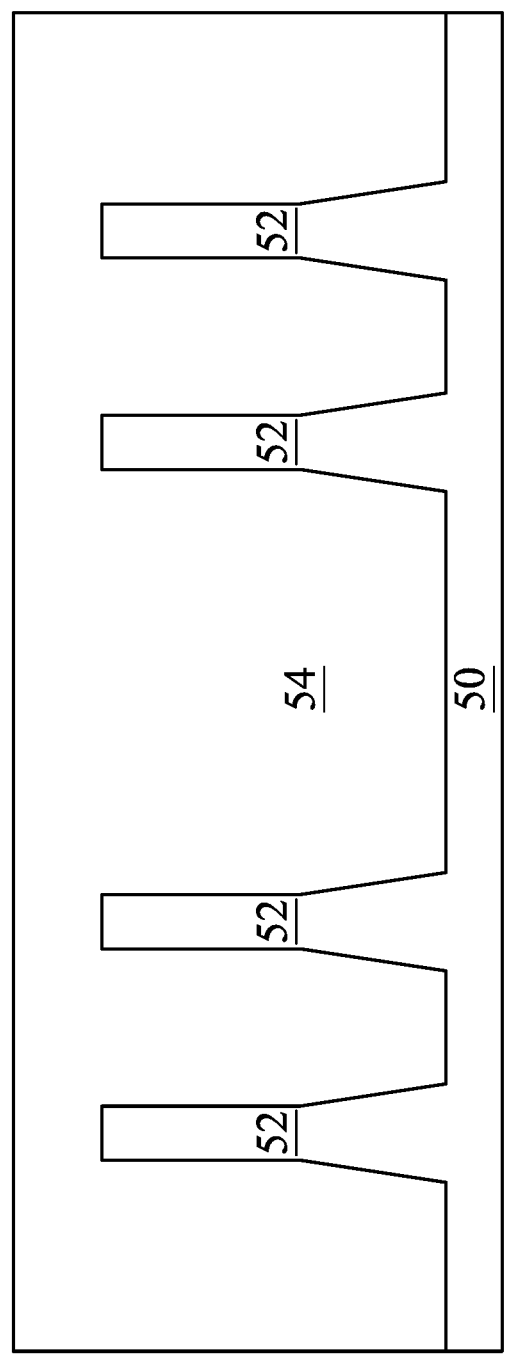

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
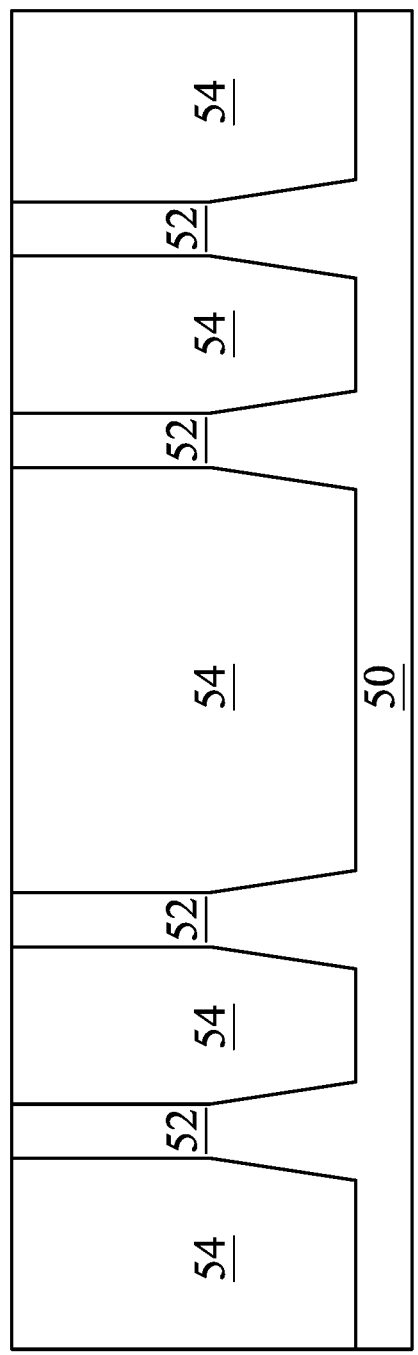

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
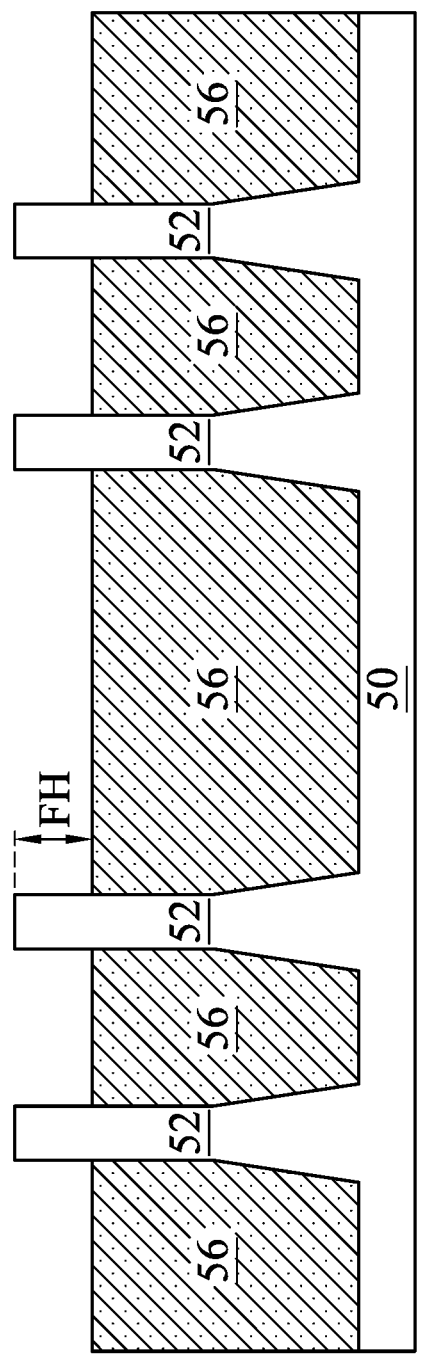

In FIG. 6, the insulation material 54 is recessed to form Shallow Trench Isolation (STI) regions 56. The insulation material 54 is recessed such that upper portions of fins 52 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used. After forming the STI regions, the fins 52 may protrude to a fin height FH above the top surface of the STI regions in a range of about 20 nm to about 80 nm.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material.

In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region (e.g., an NMOS region) different from the material in the p-type region (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in an n-type region, and an N well may be formed in a p-type region. In some embodiments, a P well or an N well are formed in both an n-type region and a p-type region.

In the embodiments with different well types, the different implant steps for an n-type region and a p-type region may be achieved using a photoresist and/or other masks (not shown). For example, a photoresist may be formed over the fins 52 and the STI regions 56 in the n-type region. The photoresist is patterned to expose the p-type region of the substrate 50. The photoresist can be formed by using a spin-on technique and can be patterned using acceptable photolithography techniques. Once the photoresist is patterned, an n-type impurity implant is performed in the p-type region, and the photoresist may act as a mask to substantially prevent n-type impurities from being implanted into the n-type region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region, a photoresist is formed over the fins 52 and the STI regions 56 in the p-type region. The photoresist is patterned to expose the n-type region of the substrate 50. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region and the p-type region, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
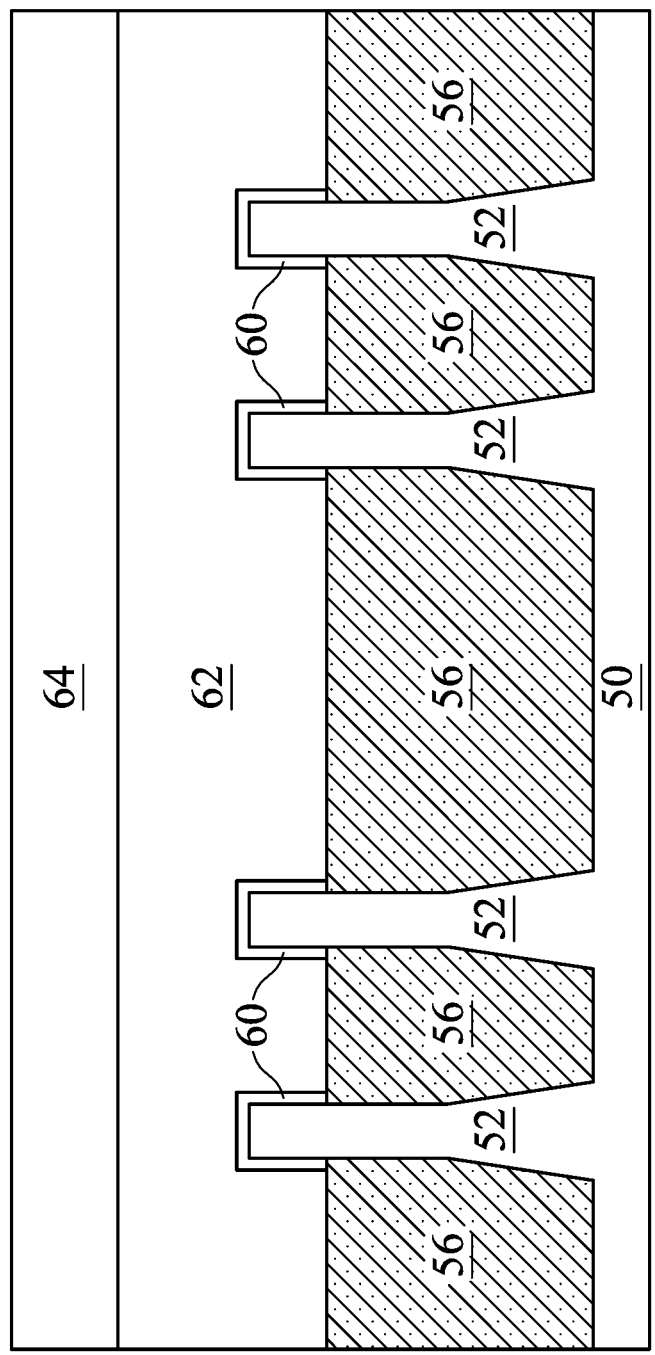

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 22B illustrate various additional steps in the manufacturing of embodiment devices. FIGS. 8A through 22B illustrate features in either of the n-type region and the p-type region. For example, the structures illustrated in FIGS. 8A through 22B may be applicable to both the n-type region and the p-type region. Differences (if any) in the structures of the n-type region and the p-type region are described in the text accompanying each figure.

Figure 8B:
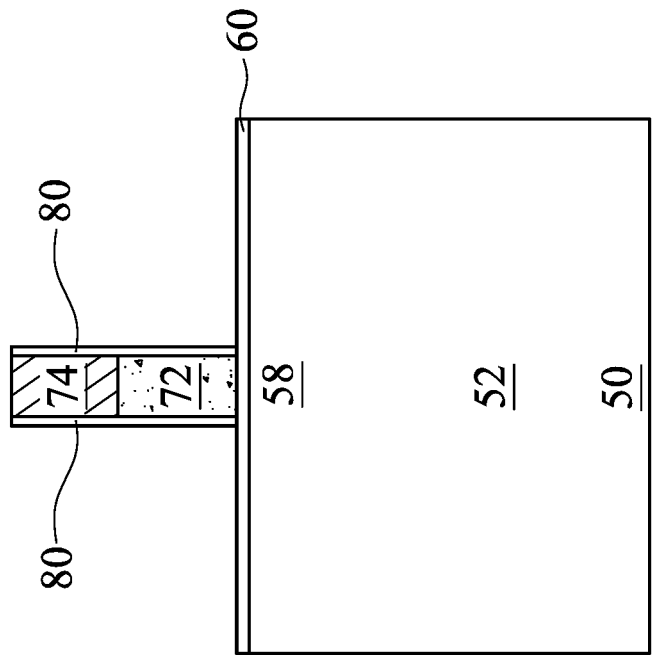
Figure 8A:
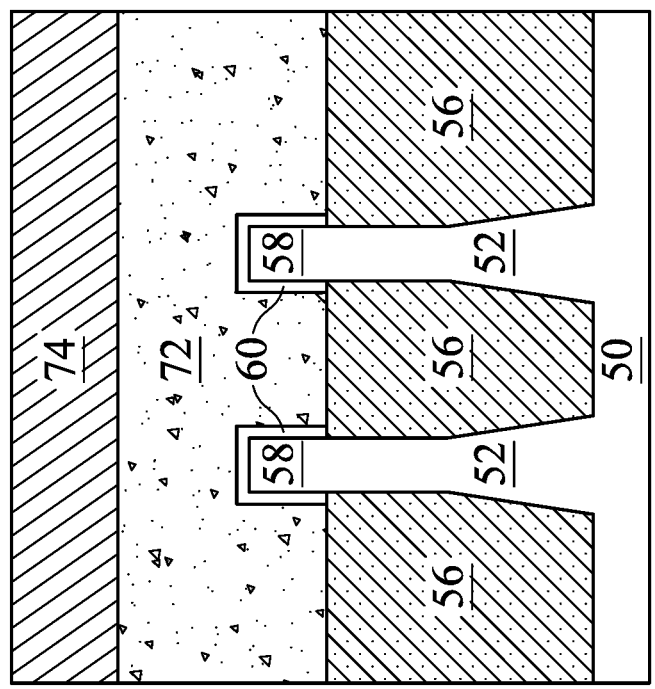
Figure 8D:
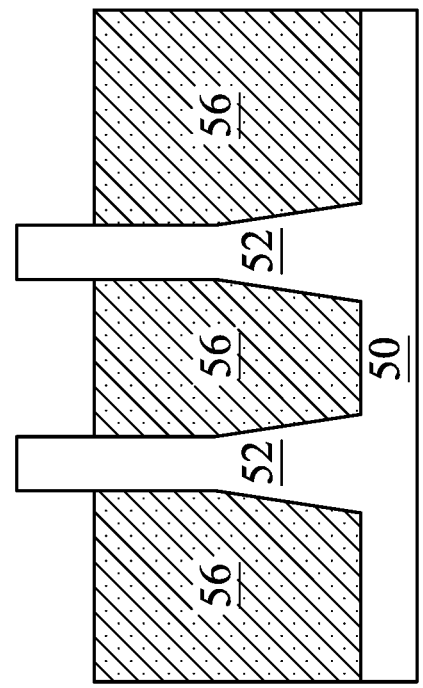
Figure 8C:
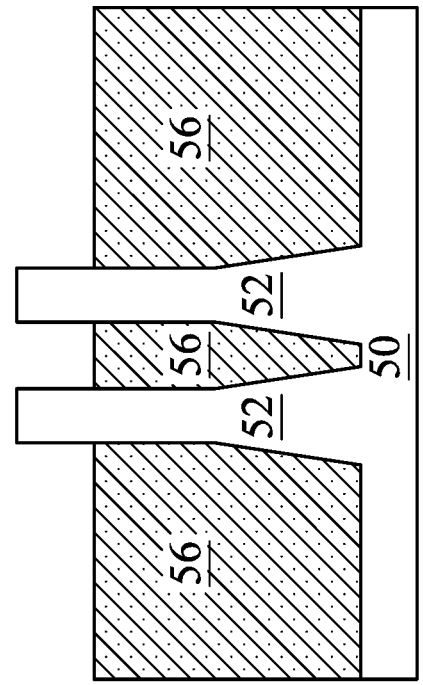

In FIGS. 8A, 8B, 8C, and 8D, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52. FIGS. 8C and 8D are illustrated along reference cross-section C-C as illustrated in FIG. 1 in a merged region 500 and a separate region 600, respectively. The merged region 500 may be a device region used for the formation of merged epitaxial source/drain regions on multiple fins and the separate region 600 may be a device region used for the formation of separate epitaxial regions on single fins, as shown below in FIGS. 16C and 16D, respectively. The dummy gate layer 62 has been removed from over the portions of the fins 52 adjacent to the dummy gates 72 as illustrated in FIGS. 8C and 8D.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like. In some embodiments, the gate seal spacers 80 are not formed.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over an n-type region, while exposing a p-type region, and appropriate type (e.g., p-type) impurities may be implanted into the exposed fins 52 in the p-type region. The mask may then be removed. Subsequently, a mask, such as a photoresist, may be formed over the p-type region while exposing the n-type region, and appropriate type impurities (e.g., n-type) may be implanted into the exposed fins 52 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figures 9A, 9B:
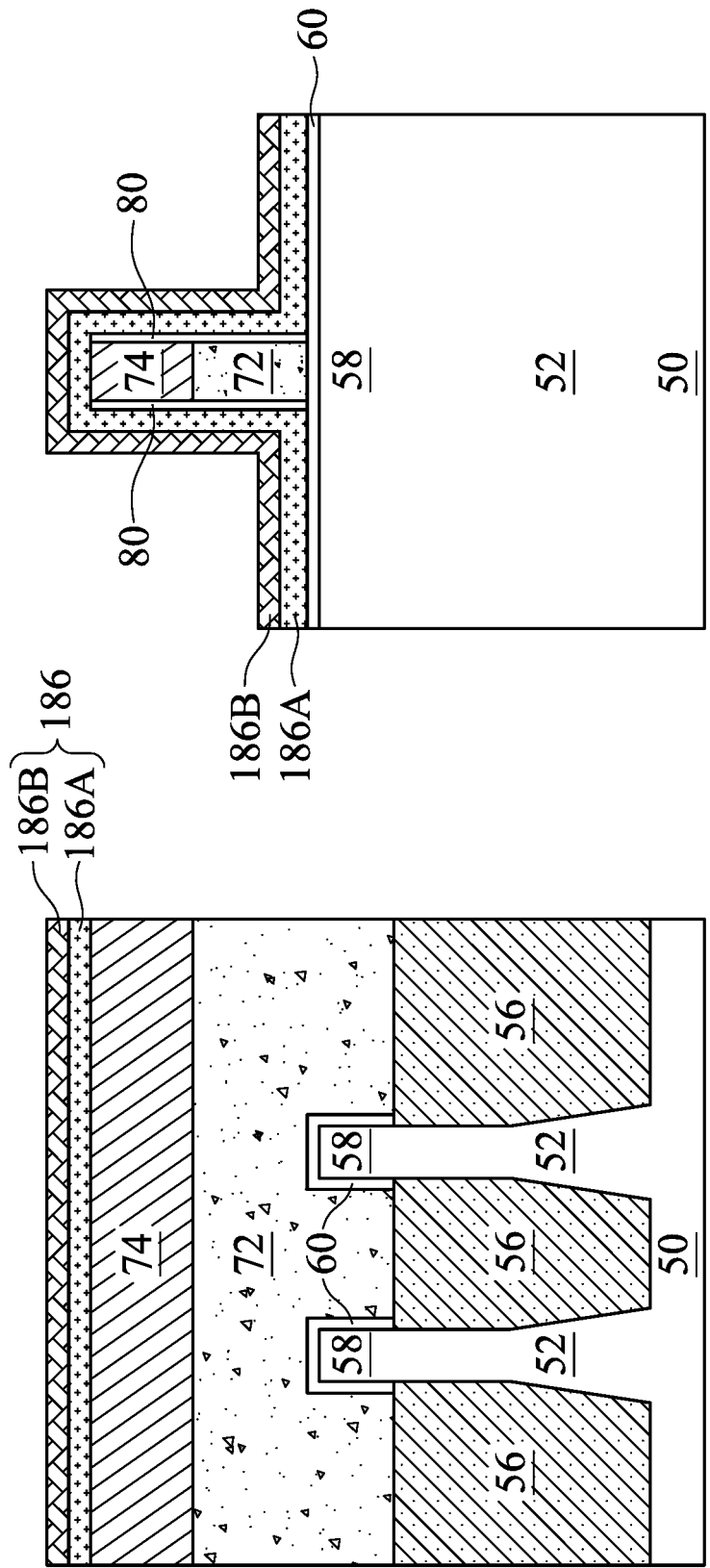
Figure 9C:
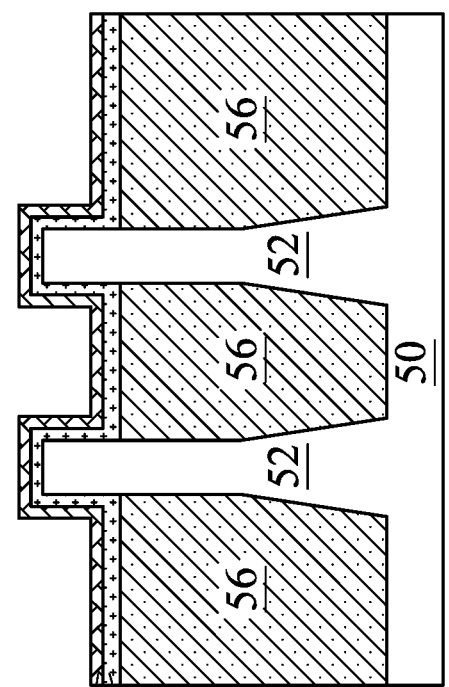
Figure 9D:
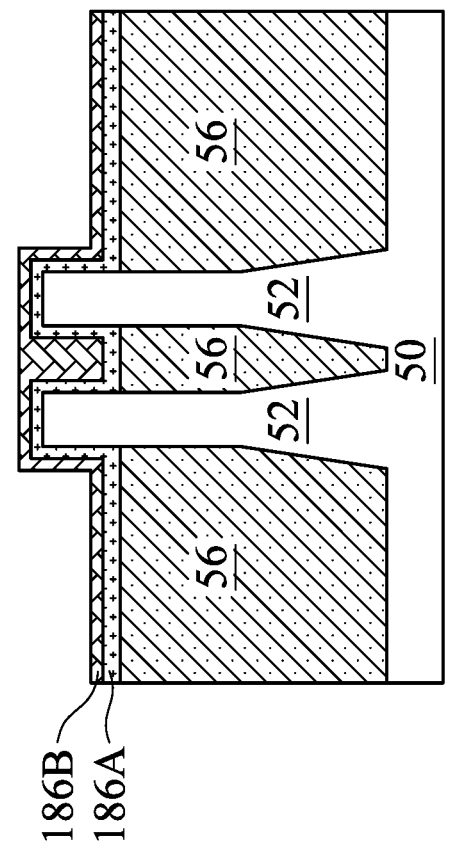

In FIGS. 9A, 9B, 9C, and 9D, one or more gate spacer layers 186 are formed over exposed surfaces of the fins 52 and the STI regions 56 and on the gate seal spacers 80 along sidewalls of the dummy gates 72 and the masks 74 in accordance with some embodiments. In the embodiment illustrated, the gate spacer layers 186 comprise a first gate subspacer layer 186A and a second gate subspacer layer 186B, also referred to as a dummy gate spacer layer 186B. In some embodiments, only one gate spacer layer, e.g. the gate spacer layer 186A, is formed. In some embodiments, more than two gate spacer layers 186 are formed. The gate spacer layers 186 may be formed by conformal deposition with any suitable process such as PVD, CVD, ALD, a combination thereof, or the like. In some embodiments, the first gate spacer layer 186A and the second gate spacer layer 186B comprise silicon oxide, silicon nitride, silicon oxynitride, silicon carbonitride, a combination thereof, or the like. Materials selected for the first gate spacer layer 186A and the second gate spacer layer 186B may differ to provide an etch selectivity between the first gate spacer layer 186A and the second gate spacer layer 186B, thereby allowing the first gate spacer layer 186A and the second gate spacer layer 186B to be individually patterned. In accordance with some embodiments as illustrated by FIG. 9C, the gate spacer layers 186 fill the gap between adjacent fins 52.

FIGS. 10A1, 10B1, and 10C illustrate the merged region 500 and FIGS. 10A2, 10B2, and 10D illustrate the separate region 600. In FIGS. 10A1, 10B1, 10A2, 10B2, 10C, and 10D, a mask layer is formed and patterned over the gate spacer layers 186 to mask the separate region 600 and expose the merged region 500. In some embodiments, the mask layer comprises multiple layers, such as a top mask 202 and a bottom mask 200. The bottom mask 200 and the top mask 202 may be used to mask the separate region 600 while gate spacers 86 are formed to a desired height in the merged region 500 in order to allow subsequently formed epitaxial source/drain regions to merge (see below, FIGS. 11A1-E and 16C, 16E, and 16F). In some embodiments, the bottom mask 200 comprises a bottom anti-reflective coating (BARC), such as amorphous carbon, $C_xH_yO_z$, the like, or a combination thereof, and may be formed by processes such as spin coating. However, any suitable materials and processes may be used.

In some embodiments, the top mask 202 is formed of a photoresist (e.g., a photosensitive material), which includes photosensitive organic materials, and may be a positive photosensitive material or a negative photosensitive material. The top mask 202 may be formed using one or more deposition processes such as a spin-on process, or the like. However, any suitable process may be used to form the top mask 202. In some embodiments, as illustrated in accordance with FIGS. 10A1, 10B1, and 10C, portions of the top mask 202 and the bottom mask 200 are patterned (e.g., using a photolithographic masking and etching process) to expose the gate spacer layers 186 in the merged region 500.

Figure 10E:
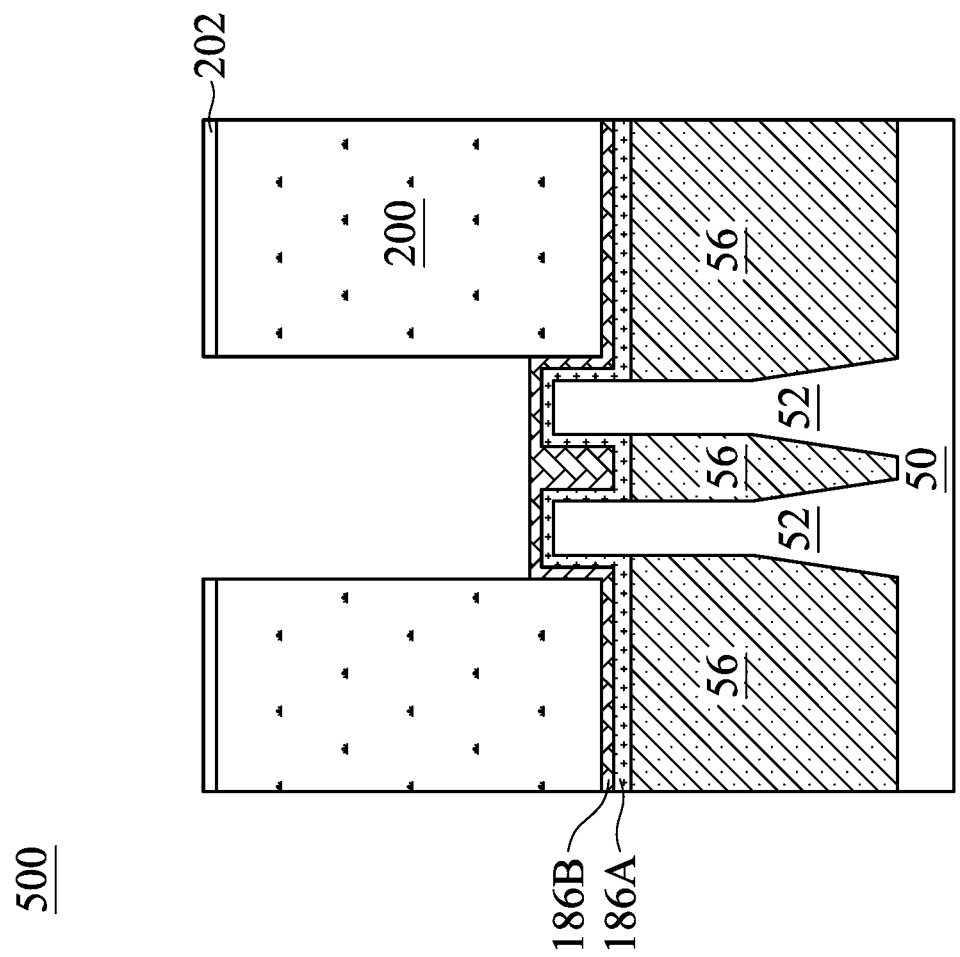

In some embodiments as illustrated in accordance with FIG. 10E, the top mask 202 and the bottom mask 210 are patterned to expose the portion of the gate spacer layers 186 directly over the fins 52 while leaving the portions of the gate spacer layers 186 over the STI regions 56 masked. This may be useful in subsequently forming gate spacers 86 that cover the STI regions 56, as illustrated below in FIG. 11E.

In FIGS. 11A1, 11B1, 11A2, 11B2, 11C, and 11D, exposed portions of the gate spacer layers 186 are patterned to form gate spacers 86 in the merged region 500 and the fins 52 are patterned to form recesses 84. Subsequently, epitaxial source/drain regions 82 may be formed in the recesses 84, as illustrated below with respect to FIGS. 16C, 16E, and 16F. In some embodiments, the gate spacers 86 and the recesses 84 are formed by the same process as described in greater detail below. The gate spacers 86 may be formed to a first height H1 less than about 20 nm and the fins 52 may be recessed to a first depth D1 measured below the top surface of the STI regions 56 less than about 30 nm. In some embodiments (not illustrated), the fins 52 may be recessed to a height above the top surface of the STI regions 56. As discussed in greater detail below, the height H1 of the gate spacers 86 may be selected so that epitaxial source/drain regions 82 subsequently grown on the fins 52 between the gate spacers 86 (see below, FIGS. 16C and 16E) merge over the gate spacers 86. In embodiments in which the fins 52 comprise silicon fins and the gate spacers 86 comprise silicon oxide, silicon nitride, silicon oxynitride, silicon carbonitride, the like, or a combination thereof, the gate spacers 86 may be patterned and the recesses 84 may be formed using, for example, an anisotropic etch, such as a dry etch comprising $CF_4$, $CHF_3$, $O_2$, HBr, the like, or a combination thereof. However, any suitable process may be used to form the gate spacers 86. The first height H1 and the first depth D1 may be controlled by adjusting the duration of the etching time, controlling a power source, controlling a bias power, or the like.

For example, in some embodiments in which the height of the fins FH (see FIG. 6) above the STI regions 56 is in a range of about 20 nm to about 80 nm and the pitch P1 between the fins 52 (see below, FIG. 16C) is in a range of about 10 nm to about 40 nm, the height H1 of the gate spacers 86 may be formed to be in a range of less than about 20 nm and the first depth D1 of the recesses 84 may be formed to be in a range of about 30 nm below a top surface of the STI regions 56 to about 30 nm above a top surface of the STI regions 56 with a dry etch by adjusting the duration of the etching time in a range of about 10 s to about 300 s while controlling the power source of the etch to be in a range of about 800 W to about 1200 W and the bias power of the etch to be in a range of about 30 W to about 300 W.

In some embodiments, the gate spacers 86 comprise multiple gate subspacers, such as first gate subspacers 86A and second gate subspacers 86B. The first gate subspacers 86A may be formed from the first gate spacer layer 186A and the second gate subspacers 86B may be formed from the second gate spacer layer 186B. However, the gate spacers 86 may comprise any suitable number of gate subspacers. In some embodiments, a first gate subspacer 86A over the STI region 56 between two fins 52 in the merged region 500 comprises a U shape, and a second gate subspacer 86B fills the gap in the U shape so that the top surface of the gate subspacer 86B is level with the top surface of the gate sub spacer 86A, as shown in FIG. 11C.

Figure 11E:
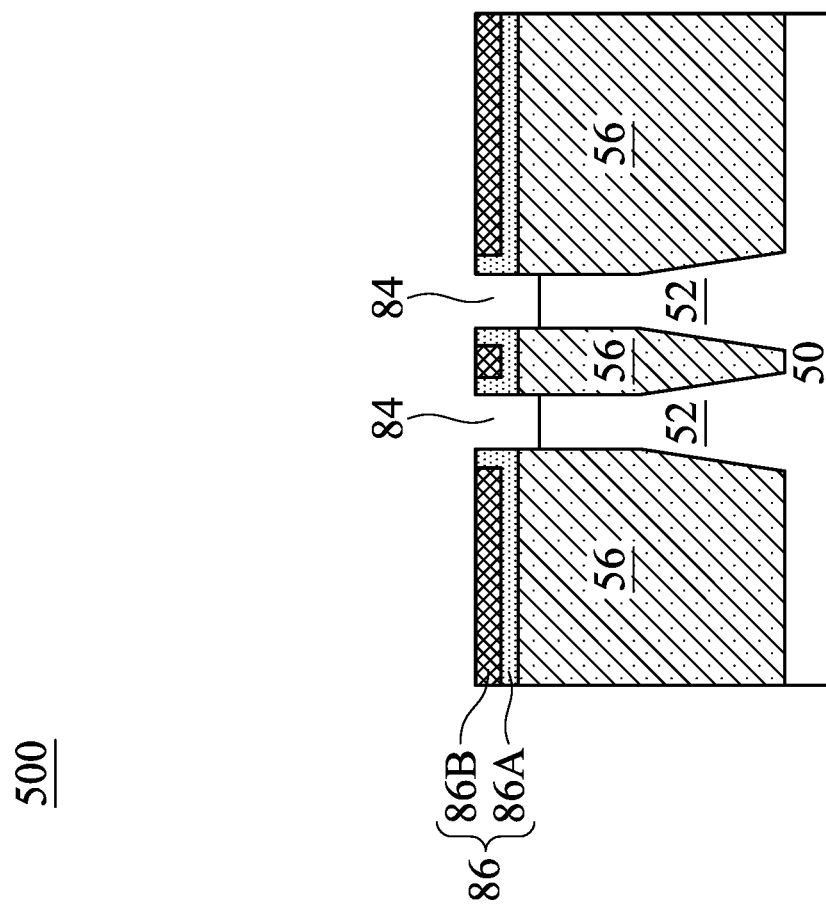
Figure 12D:
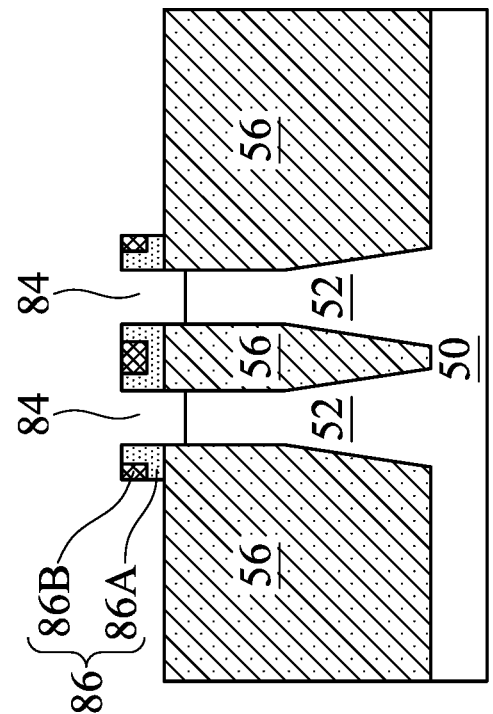
Figure 12C:
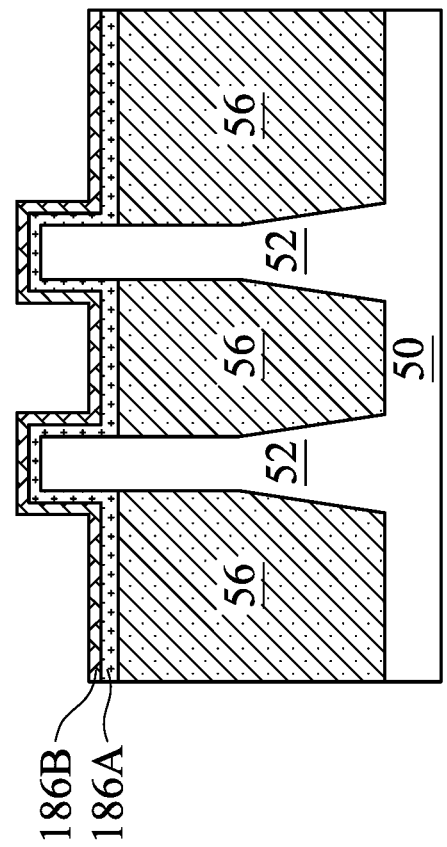

In some embodiments, as illustrated by FIG. 11E, the gate spacer layers 186 over portions of the STI regions 56 are masked as described above in reference to FIG. 10E, resulting in the masked portions of the gate spacer layers 186 not being etched. The resulting gate spacers 86 may cover portions of the STI regions 56, up to all of the STI regions 56. As illustrated in FIG. 11C, two pairs of gate spacers 86 are formed in the merged region 500; however, any suitable number of gate spacers 86 may be formed.

In FIGS. 12A1, 12B1, 12A2, 12B2, 12C, and 12D, the remaining portions of the bottom mask 200 and the top mask 202 are removed in order to expose the separate region 600 for further processing. The bottom mask 200 and the top mask 202 may be removed by a plasma ashing using a suitable reactive species such as oxygen or fluorine. However, the bottom mask 200 and the top mask 202 may be removed by any other suitable process, such as a dry or wet etching.

In FIGS. 13A1, 13B1, 13A2, 13B2, 13C, and 13D, a mask layer is formed to mask the merged region 500 and expose the separate region 600. The bottom mask 210 and the top mask 212 may be used to pattern the gate spacer layers 186 in the separate region 600 in order to form the gate spacers 86' to a desired height in order to inhibit subsequently formed epitaxial source/drain regions from merging (see below, FIGS. 14A1-E, 16D, and 16G). The bottom mask 210 and the top mask 212 may be formed using substantially similar materials and processes as the bottom mask 200 and the top mask 202, respectively. However, other suitable materials and processes may be used. In some embodiments, as illustrated in accordance with FIGS. 13A1, 13B1, and 13D, portions of the top mask 212 and the bottom mask 210 are patterned (e.g., using a photolithographic masking and etching process) to expose the gate spacer layers 186 in the separate region 600.

In FIGS. 14A1, 14A2, 14B1, 14B2, 14C, and 14D, gate spacers 86' are formed in the separate region 600 from the exposed gate spacer layers 186, and the fins 52 are patterned to form recesses 84. Subsequently, epitaxial source/drain regions 82 may be formed in the recesses 84, as illustrated below with respect to FIGS. 16D and 16G. Gate spacers 86' in the separate region 600 may be formed to have a greater height that the gate spacers 86 in the merged region 500. By utilizing different spacer heights, the point at which the subsequently formed epitaxial source/drain regions 82 begin to laterally grow over the gate spacers 86 and the gate spacers 86' may be controlled. As the epitaxial process used to form the epitaxial regions 82 progresses, the epitaxial region 82 will reach upper surfaces of the shorter gate spacers 86 in the merged region 500 prior to the epitaxial region 82 reaching upper surfaces of the gate spacers 86' in the separate region 600 due to the relatively deeper recesses 84 in the separate region 600 taking a longer time to be filled by the epitaxial process. Due to this, the epitaxial region 82 in the merged region will begin a lateral growth prior to the epitaxial region 82 in the separate region. As the lateral growth continues, the epitaxial region 82 in the merged region 500 merges prior to the epitaxial region 82 in the separate region 600. In this manner, greater control may be achieved over the shape (e.g., merging) of the source/drain epitaxial regions while using a single epitaxial growth process, thereby reducing process variations and costs.

In some embodiments, the gate spacers 86' and the recesses 84 are formed by the same process. The gate spacers 86' may be formed to a second height H2 in a range of about 5 nm to about 50 nm and the fins 52 may be recessed to a second depth D2 measured from a top surface of the STI regions 56 to a depth less than about 30 nm. In some embodiments (not illustrated), the fins 52 may be recessed to a height above the top surface of the STI regions 56 less than about 30 nm. The gate spacers 86' may be patterned and the recesses 84 may be formed using, for example, an anisotropic etch, such as a dry etch comprising $CF_4$, $CHF_3$, $O_2$, HBr, the like, or a combination thereof. However, any suitable process may be used to form the gate spacers 86'. As discussed in greater detail below the height H2 of the gate spacers 86' may be selected so that epitaxial source/drain regions 82 subsequently grown on the fins 52 between the gate spacers 86' (see below, FIGS. 16D and 16G) do not merge over the gate spacers 86'.

For example, in some embodiments in which the height of the fins FH above the STI regions 56 is in a range of about 20 nm to about 80 nm and the pitch P2 between the fins 52 (see below, FIG. 16D) is in a range of about 15 nm to about 70 nm, the height H2 of the gate spacers 86' may be formed to be in a range of about 5 nm to about 50 nm and the second depth D2 of the recesses 84 may be formed to be in a range of about 30 nm below a top surface of the STI regions 56 to about 30 nm above a top surface of the STI regions 56 with a dry etch by adjusting the duration of the etching time in a range of about 5 s to about 100 s while controlling the power source of the etch to be in a range of about 30 W to about 1000 W.

Figure 14E:
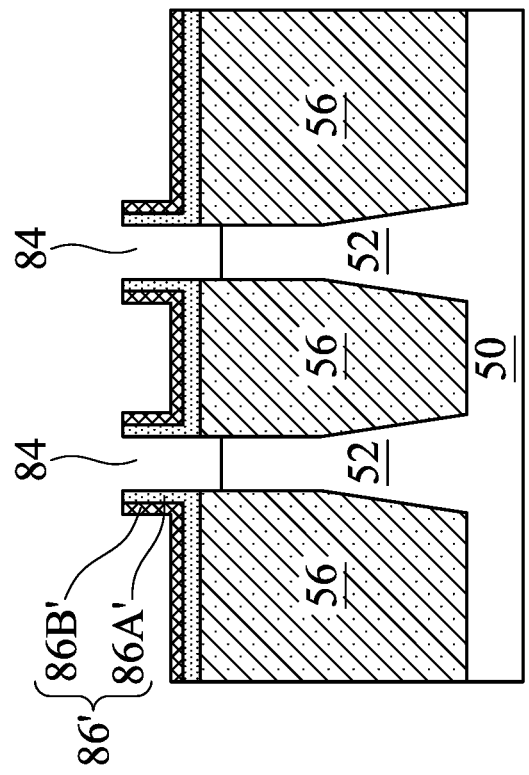

FIG. 14E illustrates another example in accordance with some embodiments in which the gate spacers 86' are formed to a taller height H5 in a range of about 20 nm to about 60 nm, which may be useful for controlling the widths and heights of subsequently formed epitaxial source/drain regions to be smaller (see below, FIG. 16G). In the illustrated embodiments, the height of the fins FH above the STI regions 56 is in a range of about 20 nm to about 80 nm, the pitch P2 between the fins 52 (see below, FIG. 16D) is in a range of about 15 nm to about 70 nm, and the height H5 of the gate spacers 86' may be formed to be in a range of about 20 nm to about 60 nm with a dry etch.

In some embodiments, the gate spacers 86' comprise multiple gate subspacers, such as first gate subspacers 86A' and second gate subspacers 86B'. The first gate subspacers 86A' may be insulating gate subspacers formed from the first gate spacer layer 186A and the second gate subspacers 86B' may be dummy gate subspacers formed from the dummy gate spacer layer 186B. However, the gate spacers 86' may comprise any suitable number of gate subspacers. As illustrated in FIG. 14D, two pairs of gate spacers 86' are formed in the separate region 600; however, any suitable number of gate spacers 86' may be formed.

Figure 14F:
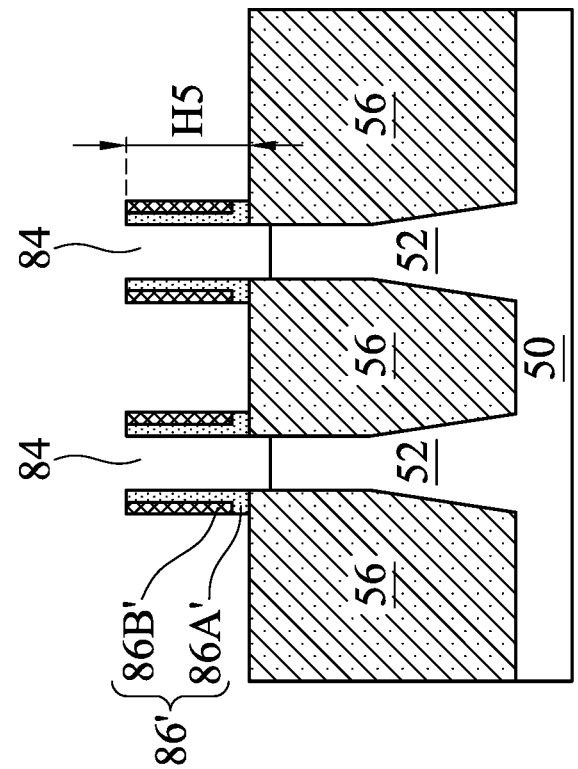
Figure 15D:
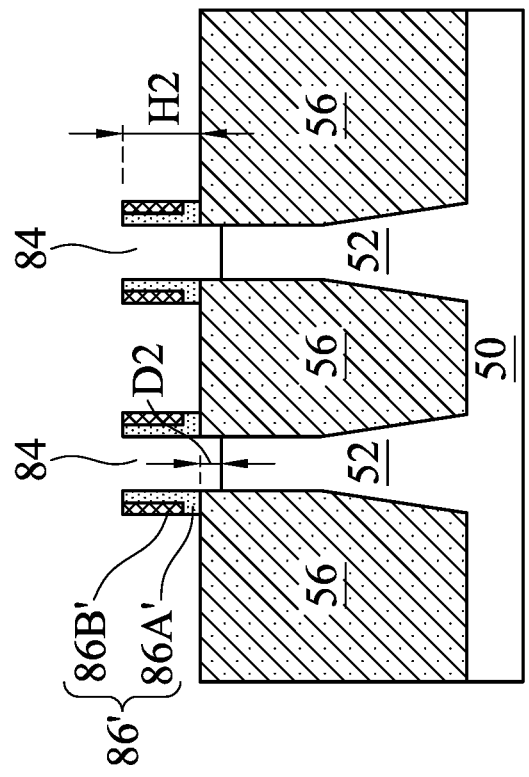
Figure 15C:
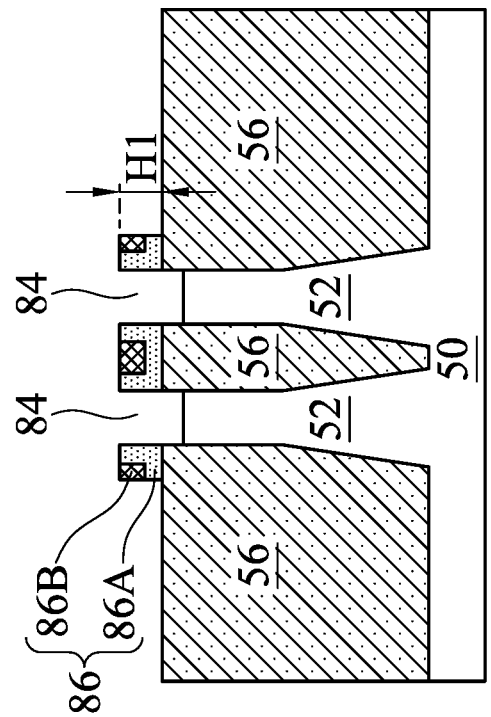

In some embodiments, as illustrated by FIG. 14F, the gate spacer layers 186 are not etched over portions of the STI regions 56, up to all of the STI regions 56, and the gate spacers 86' may cover portions of the STI regions 56, up to as all of the STI regions 56. The gate spacers 86' may be formed to cover the STI regions 56 by a substantially similar process as illustrated above for the gate spacers 86 in reference to FIGS. 10E and 11E.

In FIGS. 15A1, 15B1, 15A2, 15B2, 15C, and 15D, the remaining portions of the bottom mask 210 and the top mask 212 are removed in order to expose the merged region 500 for further processing. The bottom mask 210 and the top mask 212 may be removed by a plasma ashing using a suitable reactive species such as oxygen or fluorine. However, the bottom mask 210 and the top mask 212 may be removed by any other suitable process, such as a dry or wet etching.

The above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86 and 86', yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 16A1, 16B1, 16A2, and 16B2 epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 and/or 86' are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in n-type regions may be formed by masking p-type regions and etching source/drain regions of the fins 52 in the n-type regions to form recesses 84 in the fins 52, as shown above with reference to FIG. 14B2. Then, the epitaxial source/drain regions 82 in the n-type regions are epitaxially grown in the recesses 84. The epitaxial source/drain regions 82 may include any acceptable material, such as one or more materials from the carbon group (C, Si, Ge, . . . ) doped with one or more materials from the pnictogen group (P, As, Sb, . . . ), that are appropriate for n-type FinFETs. For example, if the fin 52 is silicon, the epitaxial source/drain regions 82 in the n-type regions may include materials exerting a tensile strain in the channel region 58, such as silicon, silicon carbide, phosphorous doped silicon carbide, silicon phosphide, or the like. The epitaxial source/drain regions 82 in the n-type regions may have surfaces raised from respective surfaces of the fins 52 and may have facets.

The epitaxial source/drain regions 82 in the p-type regions may be formed by masking the n-type regions and etching source/drain regions of the fins 52 in the p-type regions to form recesses 84 in the fins 52, as shown above with reference to FIG. 14B. Then, the epitaxial source/drain regions 82 in the p-type regions are epitaxially grown in the recesses 84. The epitaxial source/drain regions 82 may include any acceptable material, such as one or more materials from the carbon group (C, Si, Ge, Sn, . . . ) doped with one or more materials from the boron group (B, Al, Ga, In, . . . ), that are appropriate for p-type FinFETs. For example, if the fin 52 is silicon, the epitaxial source/drain regions 82 in the p-type regions may comprise materials exerting a compressive strain in the channel region 58, such as silicon-germanium, boron doped silicon-germanium, germanium, germanium tin, or the like. The epitaxial source/drain regions 82 in the p-type regions may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type regions and the p-type regions, upper surfaces of the epitaxial source/drain regions have facets which expand laterally outward beyond sidewalls of the fins 52. In the merged region 500, which may be used for forming multi-fin transistors with merged source/drain regions for use in e.g. logic devices, these facets cause adjacent source/drain regions 82 of a same FinFET to merge as illustrated by FIG. 16C. In the separate region 600, which may be used for forming single fin transistors with unmerged source/drain regions for use in e.g. SRAM devices, adjacent source/drain regions 82 remain separated after the epitaxy process is completed as illustrated by FIG. 16D.

Figure 16D:
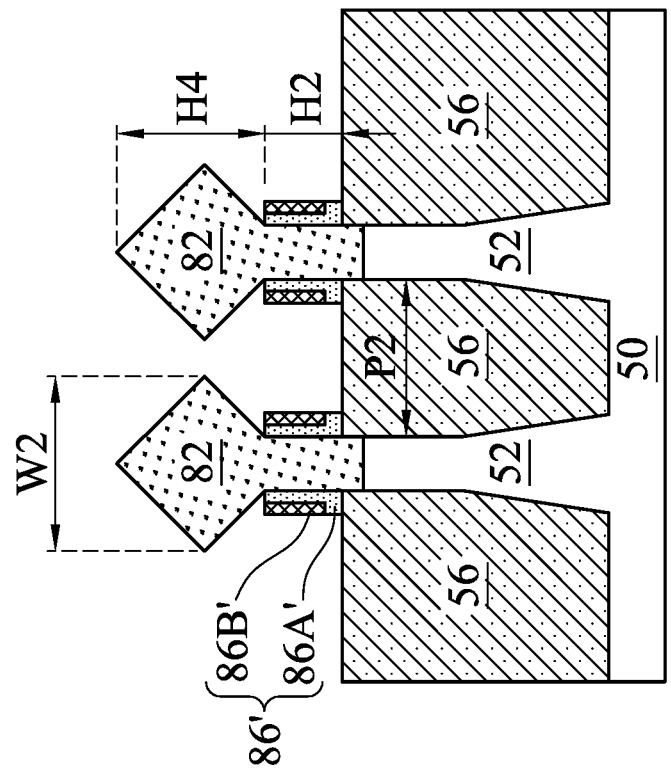
Figure 16C:
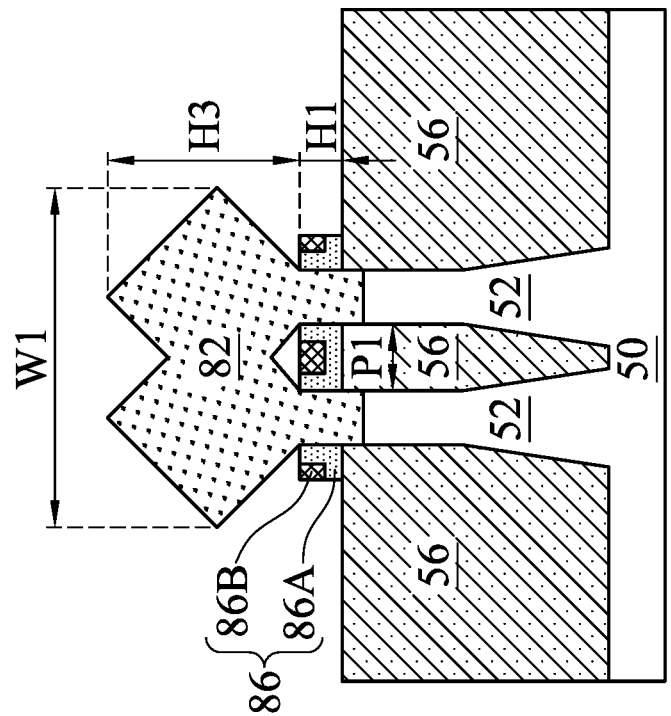

In the embodiments illustrated in FIGS. 16C and 16D, gate spacers 86 in the merged region 500 are formed having a shorter height that the gate spacers 86' in the separate region 600. By utilizing different spacer heights, the point at which the epitaxial regions 82 begins to laterally grow over the gate spacers 86 and the gate spacers 86' is controlled. For example, in the embodiment illustrated in FIGS. 16C and 16D, the gate spacers 86 in the merged region 500 have a shorter height than the spacers 86' in the separate region 600. As the epitaxial process used to form the epitaxial regions 82 progresses, the epitaxial region 82 will reach upper surfaces of the shorter gate spacers 86 in the merged region 500 prior to the epitaxial region 82 reaching upper surfaces of the gate spacers 86' in the separate region 600. As such, the epitaxial region 82 in the merged region will begin a lateral growth prior to the epitaxial region 82 in the separate region. As the lateral growth continues, the epitaxial region 82 in the merged region 500 merges prior to the epitaxial region 82 in the separate region 600. In this manner, greater control may be achieved over the shape (e.g., merging) of the source/drain epitaxial regions while using a single epitaxial growth process, thereby reducing process variations and costs.

In some embodiments, the height H1 of the gate spacers 86 and the height H2 of the gate spacers 86' have a difference in height $\Delta H_{21}$ in a range of about 5 nm to about 30 nm, which may be advantageous for forming merged epitaxial source/drain regions 82 in the merged region 500 above the gate spacers 86 and leading epitaxial source/drain regions 82 in the separate region 600 above the gate spacers 86' to remaining separate. A difference in height $\Delta H_{21}$ less than 5 nm may allow the epitaxial source/drain regions 82 in the separate region 600 to unfavorably merge, which may lead to transistor shorts and yield loss, or it may lead to the epitaxial source/drain regions 82 in the separate region 600 to remain separate, which may lead to loss of device function and yield loss. A difference in height $\Delta H_{21}$ greater than 30 nm may exceed the desired product design size, which may lead to loss of device function and yield loss.

Figure 16F:
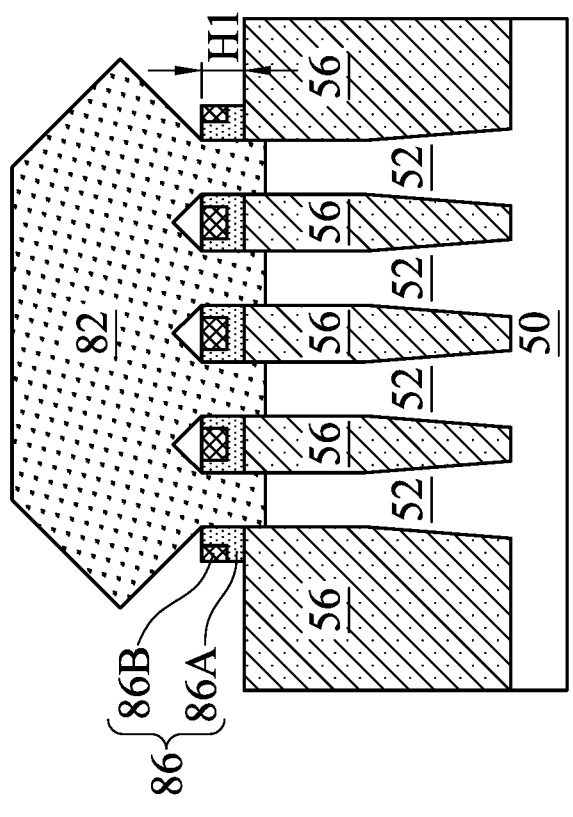
Figure 16E:
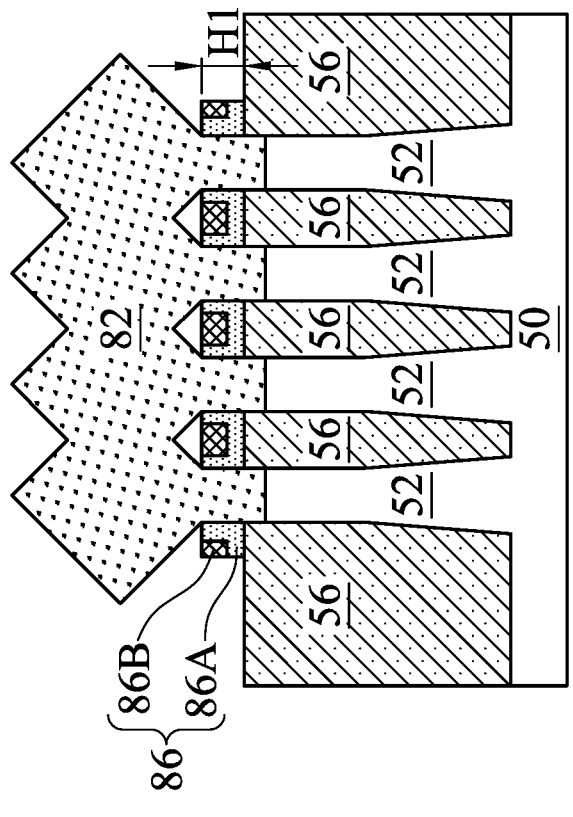
Figure 16G:
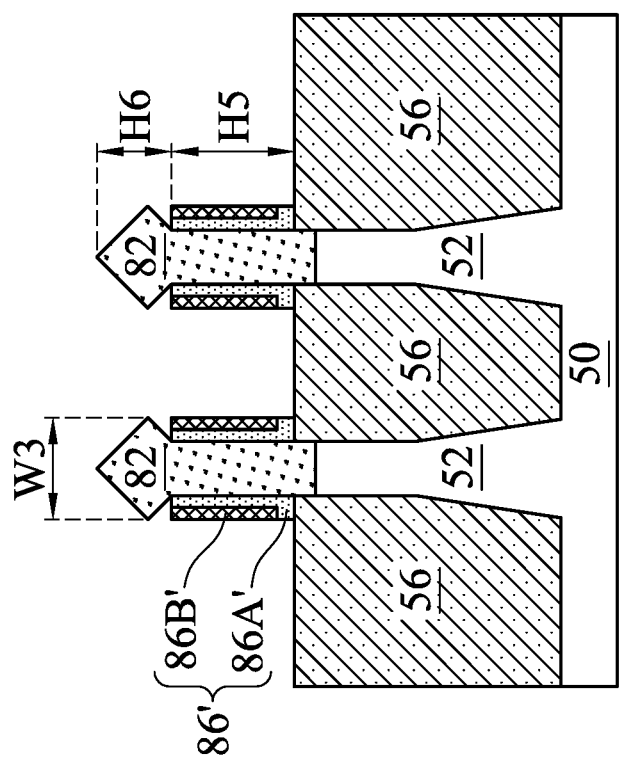

In addition to controlling merging/separation of the epitaxial source/drain regions 82 by adjusting or controlling the spacer heights, some embodiments may utilize different fin spacing. For example, in some embodiments, the fins 52 in the merged region 500 are separated by a pitch P1 in a range of about 10 nm to about 40 nm, and fins 52 in the separate region 600 are separated by a pitch P2 substantially greater than P1, where P2 is in a range of about 15 nm to about 70 nm. Fins 52 separated by a pitch P1 in the merged region 500 may be useful for forming multiple fin transistors with merged source/drain regions extending from multiple neighboring fins 52 as shown in FIGS. 16C, 16E, and 16F, such as e.g. logic devices. Fins 52 separated by a pitch P2 in the separate region 600 may be useful for forming single fin transistors with source/drain regions extending from single fins 52 without merging with source/drain regions on neighboring fins 52 as shown in FIGS. 16D and 16G, such as e.g. static random access memory (SRAM) devices.

The difference in spacer height $\Delta H_{21}$ being in a range of about 5 nm to about 30 nm may allow for a difference in pitch $\Delta P_{21}$ between the pitch P2 and the pitch P1 to be in a range of about 5 nm to about 30 nm while allowing the epitaxial source/drain regions 82 to merge in the merged region 500 and forming separated epitaxial source/drain regions 82 in the separate region 600, which may be useful for, e.g., improved device function of single fin FinFETs in the separate region 600 and double fin FinFETs in the merged region 500.

In some embodiments, the merged epitaxial source/drain regions 82 in the merged region 500 have a width W1 in a range of about 20 nm to about 80 nm, which may be useful for improved device function, and a height H3 in a range of about 20 nm to about 80 nm, which may be useful for improved device function. The ratio of the height H1 to the width W1 may be less than about 1.0. The ratio of the height H1 to the height H3 may be less than about 1.0.

In some embodiments, the separate epitaxial source/drain regions 82 in the separate region 600 have a width W2 in a range of about 15 nm to about 60 nm, which may be useful for improved device function, and a height H4 in a range of about 15 nm to about 60 nm, which may be useful for improved device function. The ratio of the height H2 to the width W2 may be in a range of about 1:12 to about 10:3. The ratio of the height H2 to the height H4 may be in a range of about 1:12 to about 10:3.

In some embodiments, epitaxial source/drain regions 82 extending from more than two fins 52 may merge together to form a merged epitaxial source/drain regions 82 on a multi-fin FinFET. For example, FIGS. 16E and 16F illustrate four epitaxial source/drain regions 82 merged together to form a merged epitaxial source/drain region 82 on a four-fin FinFET. In some embodiments, three or more than four epitaxial source/drain regions 82 extending from three or more than four fins 52 may merge together to form a merged epitaxial source/drain regions 82 on a multi-fin FinFET with three or more than four fins 52. In some embodiments, a top surface of the merged epitaxial source/region 82 may have recesses, as illustrated in FIG. 16E. In some embodiments, facets of the merged epitaxial source/region 82 may merge to form a substantially flat top surface, as illustrated in FIG. 16F.

The heights of the gate spacers 86 and/or 86' may be controlled to adjust the epitaxial source/drain regions. For example, FIG. 16G illustrates some embodiments in which the gate spacers 86' in the separate region 600 were formed to a height H5 in a range of about 20 nm to about 60 nm (see above, FIG. 14E). This may lead to the separate epitaxial source/drain regions 82 having widths W3 in a range of about 5 nm to about 40 nm and heights H6 in a range of about 10 nm to about 40 nm. The ratio of the height H5 to the width W3 may be in a range of about 0.5 to about 12.0. The ratio of the height H5 to the height H6 may be in a range of about 0.5 to about 6.0.

Figure 17B:
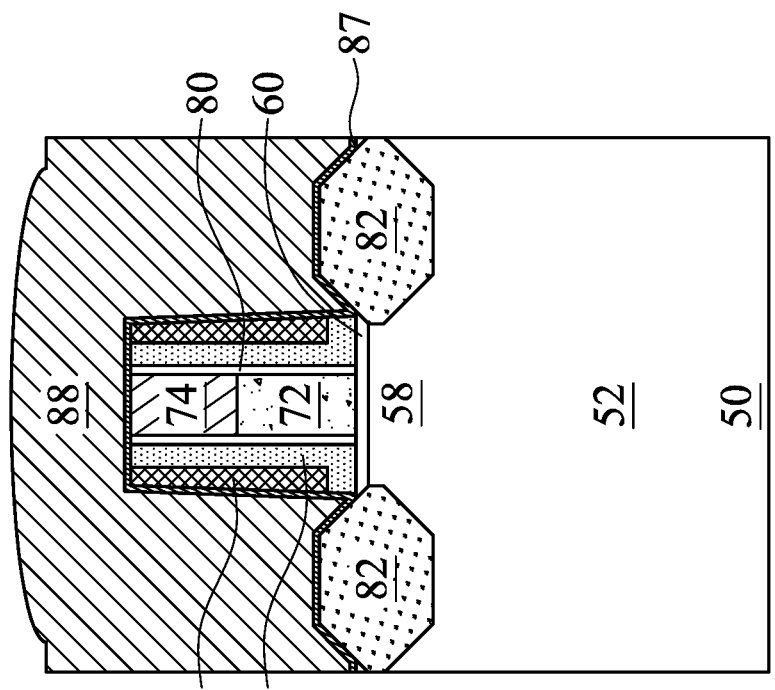
Figure 17A:
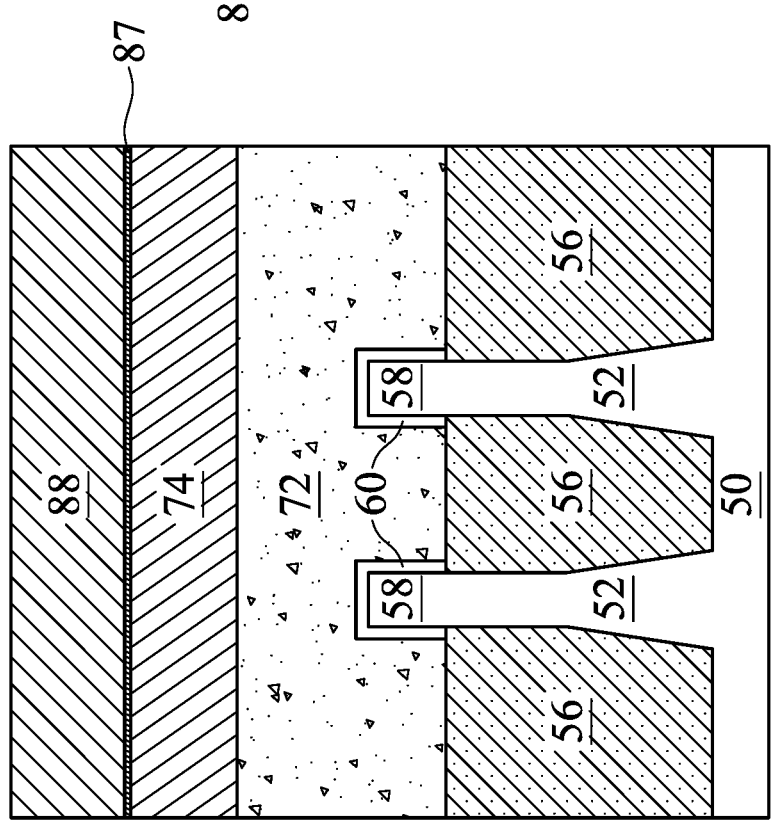

In FIGS. 17A and 17B, a first interlayer dielectric (ILD) 88 is deposited over the structure illustrated in FIGS. 16A2 and 16B2. FIGS. 17A and 17B are illustrated in the separate region 600 as following from FIGS. 16A1 and 16A2 for a structure including gate spacers 86' for illustrative purposes. Substantially similar processes and materials may be used in merged region 500 for a structure including gate spacers 86. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18B:
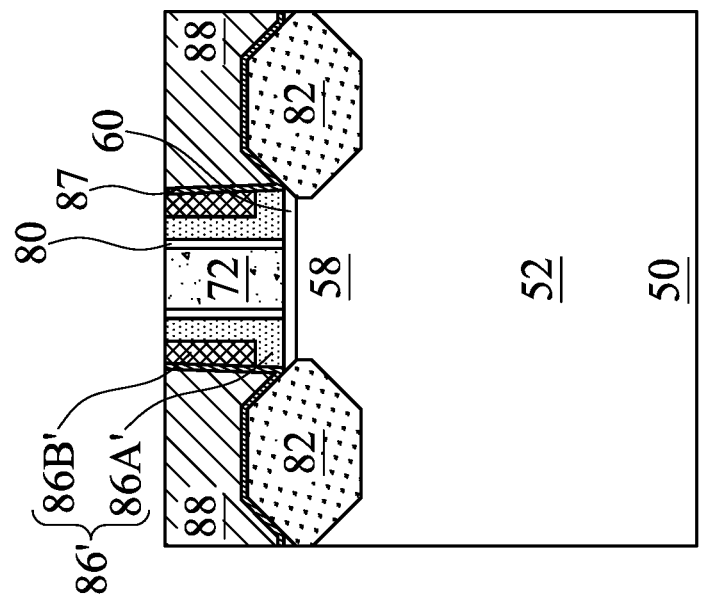
Figure 18A:
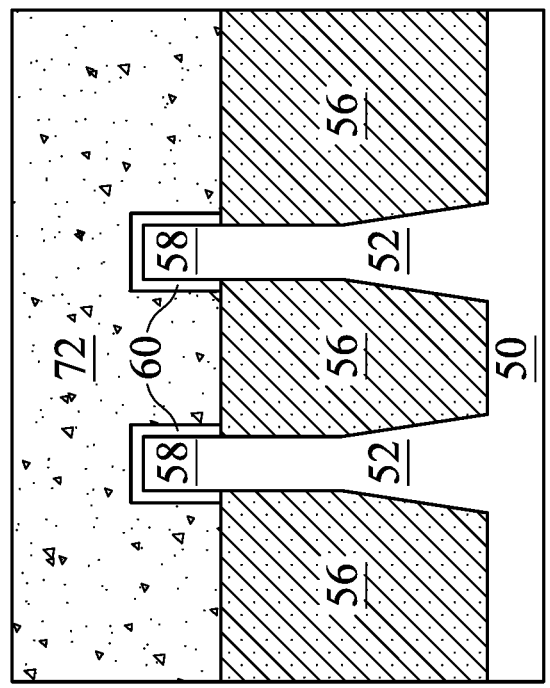

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 and/or 86' along sidewalls of the masks 74. After the planarization process, top surfaces of the dummy gates 72, the gate seal spacers 80, the gate spacers 86 and/or 86', and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 19B:
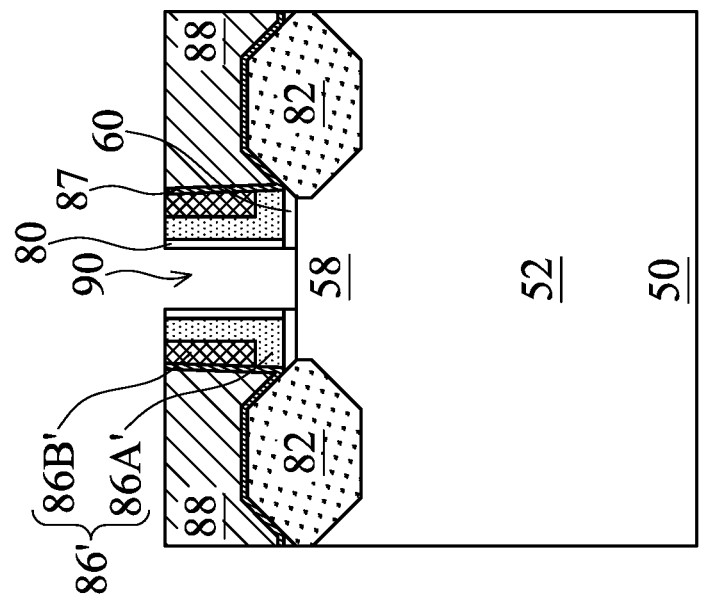
Figure 19A:
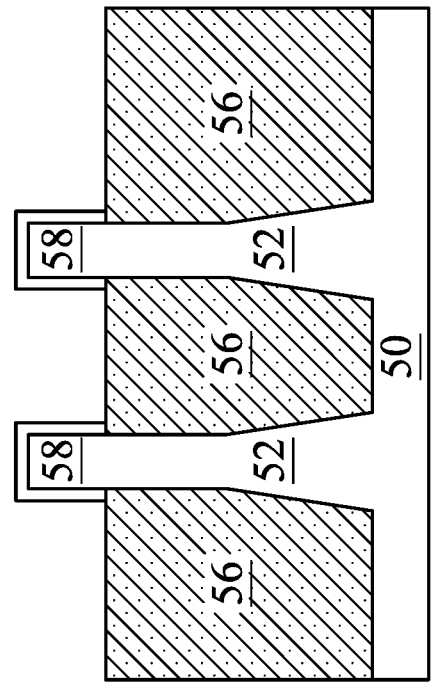

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86 and/or 86'. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 20B:
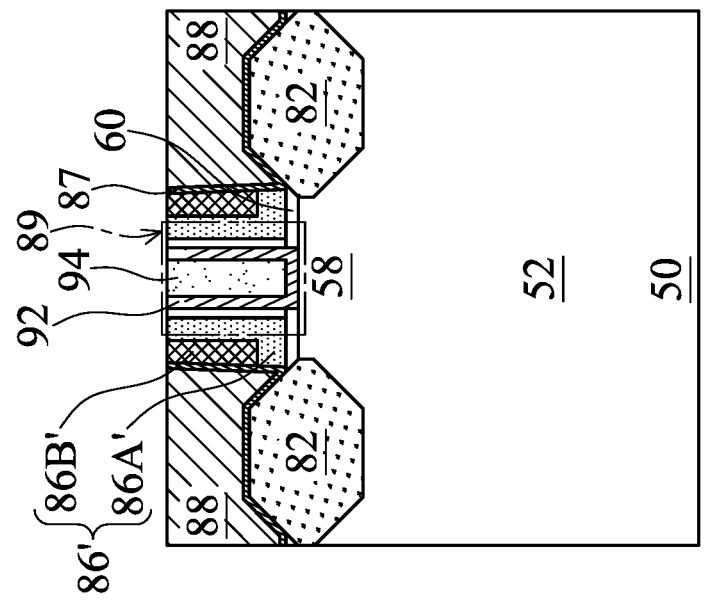
Figure 20A:
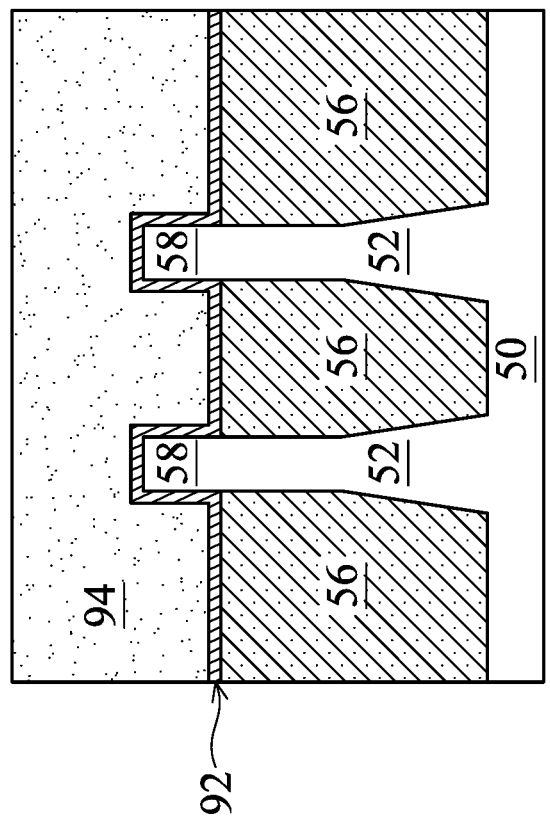

In FIGS. 20A and 20B, gate dielectric layers 92 and gate electrodes 94 are formed for replacement gates. FIG. 20C illustrates a detailed view of region 89 of FIG. 20B. Gate dielectric layers 92 one or more layers deposited in the recesses 90, such as on the top surfaces and the sidewalls of the fins 52 and on sidewalls of the gate seal spacers 80/gate spacers 86/86'. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region and the p-type region may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 21B:
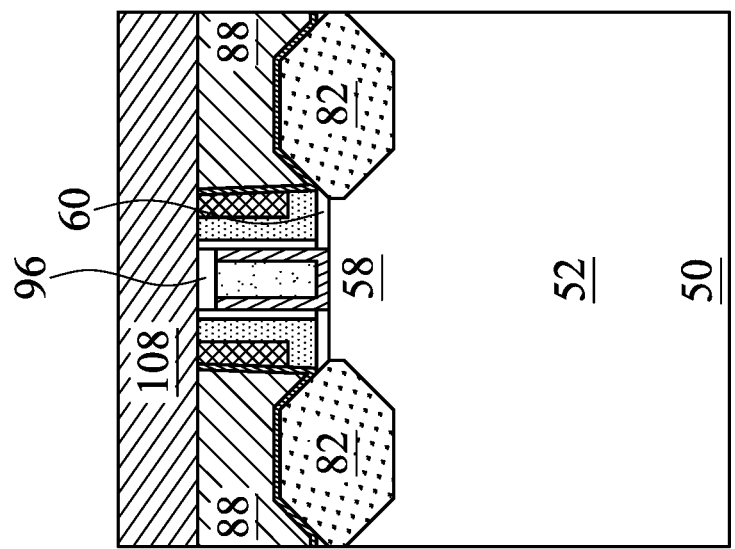
Figure 21A:
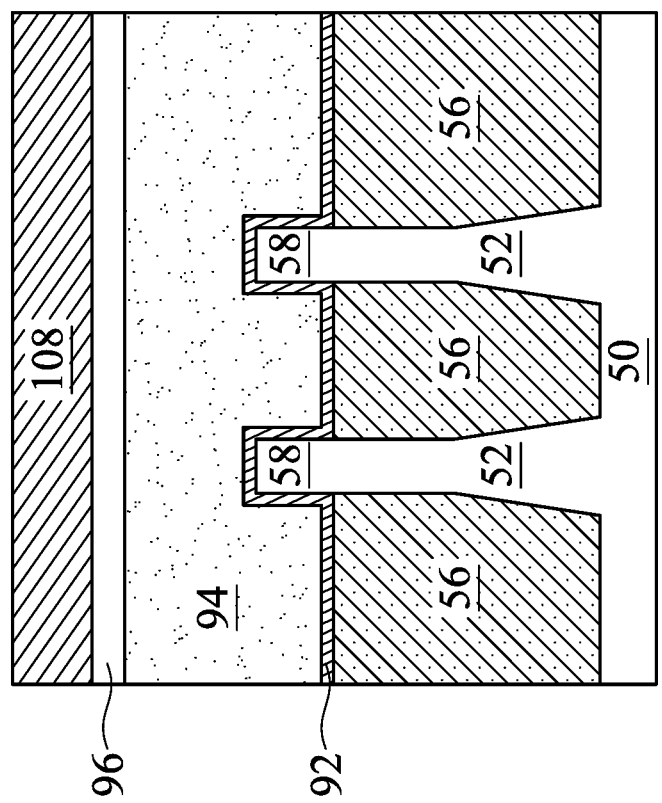

In FIGS. 21A and 21B, a gate mask 96 is formed over the gate stack (including a gate dielectric layer 92 and a corresponding gate electrode 94), and the gate mask may be disposed between opposing portions of the gate spacers 86 and/or 86'. In some embodiments, forming the gate mask 96 includes recessing the gate stack so that a recess is formed directly over the gate stack and between opposing portions of gate spacers 86 and/or 86'. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 22A and 22B) penetrate through the second ILD 108 and the gate mask 96 to contact the top surface of the recessed gate electrode 94.

Figure 22B:
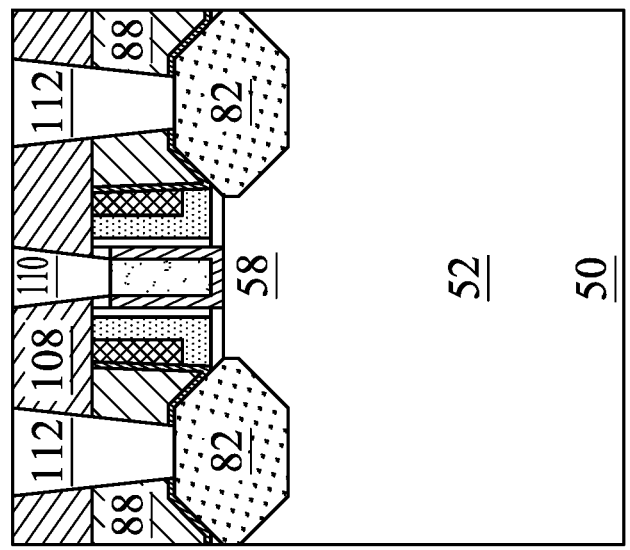
Figure 22A:
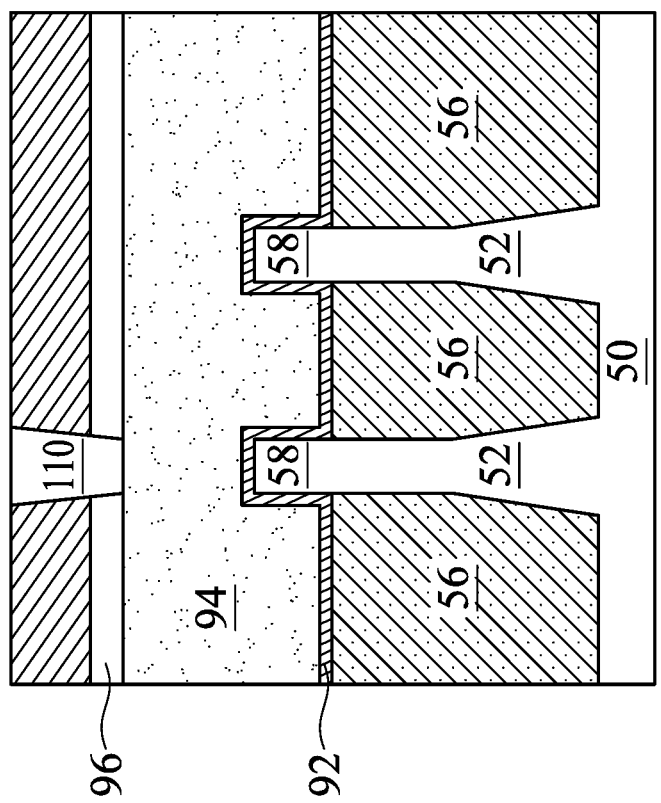

In FIGS. 22A and 22B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments disclosed above may provide advantages. Gate spacer heights may be controlled in order to determine critical dimensions (CDs) of source/drain regions for various devices to avoid yield loss. To increase yield throughput, n-type and p-type epitaxial source/drain regions may be simultaneously epitaxially grown across n-type regions and p-type regions, respectively, for multi-fin transistors in, e.g., logic device regions, while simultaneously epitaxially growing separate source/drain regions for single fin transistors in, e.g., static random access memory (SRAM) device regions. Gate spacers may be formed to different heights in, e.g., logic device and SRAM device regions, to encourage or inhibit merging of epitaxial source/drain regions during the same epitaxial growth process. Yield loss from shorts may be reduced by inhibiting undesired merging of epitaxial source/drain regions across single fin transistors. Controlling gate spacer heights may also be useful for determining CDs such as widths and heights of the epitaxial source/drain regions.

In accordance with an embodiment, a semiconductor device includes a first device region and a second device region. The first device region includes: a first source/drain region extending from a substrate; a first pair of spacers; and a second pair of spacers, the first source/drain region extending between the first pair of spacers and the second pair of spacers, the first pair of spacers and the second pair of spacers having a first height; The second device region includes a second source/drain region extending from the substrate; a third source/drain region extending from the substrate, the third source/drain region being separate from the second source/drain region; a third pair of spacers, the second source/drain region extending between the third pair of spacers; and a fourth pair of spacers, the third source/drain region extending between the fourth pair of spacers, the third pair of spacers and the fourth pair of spacers having a second height, the second height being greater than the first height. In an embodiment, the second height is greater than the first height by a margin in a range of 5 nm to 30 nm. In an embodiment, the first source/drain region has a first width in a range of 20 nm to 80 nm and a third height in a range of 20 nm to 80 nm, and wherein the second source/drain region has a second width in a range of 15 nm to 60 nm and a fourth height in a range of 15 nm to 60 nm. In an embodiment, a ratio of the first height to the first width is less than 1.0. In an embodiment, a ratio of the second height to the second width is in a range of 1:12 to 10:3. In an embodiment, both the first device region and the second device region are n-type regions or both the first device region and the second device region are p-type regions.

In accordance with another embodiment, a semiconductor device includes: a first semiconductor fin extending from a substrate; a first source/drain region extending from the first semiconductor fin; a second semiconductor fin extending from the substrate; a second source/drain region extending from the second semiconductor fin, the second source/drain region being spaced apart from the first source/drain region; a first pair of spacers covering a sidewall of bottom portions of the first source/drain region and a second pair of spacers covering a sidewall of bottom portions of the second source/drain region, the first pair of spacers and the second pair of spacers having a first height; a third semiconductor fin and a fourth semiconductor fin extending from the substrate; a third source/drain region extending from the third semiconductor fin to the fourth semiconductor fin; and a third pair of spacers covering a sidewall of a first bottom portion of the third source/drain region and a fourth pair of spacers covering a sidewall of a second bottom portion of the third source/drain region, the third pair of spacers and the fourth pair of spacers having a second height, the second height being less than the first height. In an embodiment, a portion of the third pair of spacers and the fourth pair of spacers cover a shallow trench isolation (STI) region between the third semiconductor fin and the fourth semiconductor fin. In an embodiment, the portion of the third pair of spacers and the fourth pair of spacers covering the STI region includes a first subspacer portion and a second subspacer portion, the second subspacer portion being on the first subspacer portion. In an embodiment, the first subspacer portion includes a U shape and the second subspacer portion fills a gap in the U shape. In an embodiment, the second height is less than the first height by a difference in a range of 5 nm to 30 nm. In an embodiment, the first semiconductor fin and the second semiconductor fin are separated by a first pitch, the third semiconductor fin and the fourth semiconductor fin are separated by a second pitch, and the first pitch is greater than the second pitch.

In accordance with yet another embodiment, a method of forming a semiconductor device includes: forming a spacer layer over a first pair of semiconductor fins and a second pair of semiconductor fins; etching a first portion of the spacer layer to form a plurality of first spacers along sidewalls of the first pair of semiconductor fins, the plurality of first spacers having a first height; recessing the first pair of semiconductor fins to form a first recess and a second recess; etching a second portion of the spacer layer to form a plurality of second spacers along sidewalls of the second pair of semiconductor fins, the plurality of second spacers having a second height greater than the first height; recessing the second pair of semiconductor fins to form a third recess and a fourth recess; and epitaxially growing a first source/drain region in the first recess and the second recess, a second source/drain region in the third recess, and a third source/drain region in the fourth recess, wherein the second source/drain region is spaced apart from the third source/drain region. In an embodiment, the second height is formed to be greater than the first height by a difference in a range of 5 nm to 30 nm. In an embodiment, forming the spacer layer includes forming multiple spacer sublayers. In an embodiment, the etching the first portion of the spacer layer forms a first subspacer portion including a U shape and a second subspacer portion filling a gap in the U shape. In an embodiment, etching the first portion of the spacer layer is performed using $CF_4$, $CHF_3$, $O_2$, or HBr. In an embodiment, the epitaxially growing the first source/drain region, the second source/drain region, and the third source/drain region are performed simultaneously. In an embodiment, the method includes: recessing an additional semiconductor fin adjacent to the first pair of semiconductor fins to form a fifth recess; and epitaxially growing the first source/drain region in the fifth recess. In an embodiment, the etching the first portion of the spacer layer and the recessing the first pair of semiconductor fins are performed with a same etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first device region, comprising:
a first source/drain region extending from a substrate;
a first pair of spacers;
a second pair of spacers, the first source/drain region extending between the first pair of spacers and the second pair of spacers, the first pair of spacers and the second pair of spacers having a first height; and
a second device region, comprising:
a second source/drain region extending from the substrate;
a third source/drain region extending from the substrate, the third source/drain region being separate from the second source/drain region;
a third pair of spacers, the second source/drain region extending between the third pair of spacers; and
a fourth pair of spacers, the third source/drain region extending between the fourth pair of spacers, the third pair of spacers and the fourth pair of spacers having a second height, the second height being greater than the first height by a margin in a range of 5 nm to 30 nm.

2. The semiconductor device of claim 1, wherein the first source/drain region has a first width in a range of 20 nm to 80 nm and a third height in a range of 20 nm to 80 nm, and wherein the second source/drain region has a second width in a range of 15 nm to 60 nm and a fourth height in a range of 15 nm to 60 nm.

3. The semiconductor device of claim 2, wherein a ratio of the first height to the first width is in a range of less than 1.0.

4. The semiconductor device of claim 2, wherein a ratio of the second height to the second width is in a range of 1:12 to 10:3.

5. The semiconductor device of claim 1, wherein both the first device region and the second device region are n-type regions or both the first device region and the second device region are p-type regions.

6. The semiconductor device of claim 1, wherein the first pair of spacers comprises a pair of first subspacers and a pair of second subspacers on the pair of first subspacers, and wherein the pair of first subspacers comprises a U shape.

7. The semiconductor device of claim 6, wherein the pair of second subspacers fills a gap in the U shape.

8. A semiconductor device, comprising:
a first semiconductor fin extending from a substrate;
a first source/drain region extending from the first semiconductor fin;
a second semiconductor fin extending from the substrate, the first semiconductor fin and the second semiconductor fin being separated by a first pitch;
a second source/drain region extending from the second semiconductor fin, the second source/drain region being spaced apart from the first source/drain region;
a first pair of spacers covering a sidewall of bottom portions of the first source/drain region and a second pair of spacers covering a sidewall of bottom portions of the second source/drain region, the first pair of spacers and the second pair of spacers having a first height;
a third semiconductor fin and a fourth semiconductor fin extending from the substrate, the third semiconductor fin and the fourth semiconductor fin being separated by a second pitch, the first pitch being greater than the second pitch;
a third source/drain region extending from the third semiconductor fin to the fourth semiconductor fin; and
a third pair of spacers covering a sidewall of a first bottom portion of the third source/drain region and a fourth pair of spacers covering a sidewall of a second bottom portion of the third source/drain region, the third pair of spacers and the fourth pair of spacers having a second height, the second height being less than the first height.

9. The semiconductor device of claim 8, wherein a portion of the third pair of spacers and the fourth pair of spacers cover a shallow trench isolation (STI) region between the third semiconductor fin and the fourth semiconductor fin.

10. The semiconductor device of claim 9, wherein the portion of the third pair of spacers and the fourth pair of spacers covering the STI region comprises a first subspacer portion and a second subspacer portion, the second subspacer portion being on the first subspacer portion.

11. The semiconductor device of claim 10, wherein the first subspacer portion comprises a U shape and the second subspacer portion fills a gap in the U shape.

12. The semiconductor device of claim 8, wherein the second height is less than the first height by a difference in a range of 5 nm to 30 nm.

13. The semiconductor device of claim 8, wherein the first pitch is in a range of 15 nm to 70 nm.

14. A method of forming a semiconductor device, the method comprising:
forming a spacer layer over a first pair of semiconductor fins and a second pair of semiconductor fins;
etching a first portion of the spacer layer to form a plurality of first spacers along sidewalls of the first pair of semiconductor fins, the plurality of first spacers having a first height;
recessing the first pair of semiconductor fins to form a first recess and a second recess;
etching a second portion of the spacer layer to form a plurality of second spacers along sidewalls of the second pair of semiconductor fins, the plurality of second spacers having a second height greater than the first height;
recessing the second pair of semiconductor fins to form a third recess and a fourth recess; and
epitaxially growing a first source/drain region in the first recess and the second recess, a second source/drain region in the third recess, and a third source/drain region in the fourth recess, wherein the second source/drain region is spaced apart from the third source/drain region, wherein epitaxially growing the first source/drain region, the second source/drain region, and the third source/drain region are performed simultaneously.

15. The method of claim 14, wherein the second height is formed to be greater than the first height by a difference in a range of 5 nm to 30 nm.

16. The method of claim 14, wherein forming the spacer layer comprises forming multiple spacer sublayers.

17. The method of claim 16, wherein the etching the first portion of the spacer layer forms a first subspacer portion comprising a U shape and a second subspacer portion filling a gap in the U shape.

18. The method of claim 14, wherein etching the first portion of the spacer layer is performed using $CF_4$, $CHF_3$, $O_2$, or HBr.

19. The method of claim 14 further comprising:
recessing an additional semiconductor fin adjacent to the first pair of semiconductor fins to form a fifth recess; and
epitaxially growing the first source/drain region in the fifth recess.

20. The method of claim 14, wherein the etching the first portion of the spacer layer and the recessing the first pair of semiconductor fins are performed with a same etching process.

* * * * *